(12) United States Patent
Conder

(10) Patent No.: US 11,626,968 B2
(45) Date of Patent: Apr. 11, 2023

(54) COMMUNICATION SYSTEMS, APPARATUSES AND METHODS

(71) Applicant: SOCIONEXT INC., Kanagawa (JP)

(72) Inventor: James Edward Conder, Neuried (DE)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/352,842

(22) Filed: Jun. 21, 2021

(65) Prior Publication Data
US 2022/0021511 A1    Jan. 20, 2022

(30) Foreign Application Priority Data

Jul. 16, 2020 (EP) ..................................... 20186325

(51) Int. Cl.
*H04L 7/00* (2006.01)
*H04L 5/14* (2006.01)

(52) U.S. Cl.
CPC .............. *H04L 7/0008* (2013.01); *H04L 5/14* (2013.01)

(58) Field of Classification Search
CPC ....... H04L 7/0008; H04L 7/0812; H04L 7/22; H04L 7/033; H04L 7/00; H04L 5/14; H04L 5/1469
See application file for complete search history.

(56) References Cited

U.S. PATENT DOCUMENTS

| | | |
|---|---|---|
| 6,470,057 B1 | 10/2002 | Hui et al. |
| 6,665,308 B1 | 12/2003 | Rakib et al. |
| 7,209,494 B1 | 4/2007 | Griffin et al. |
| 2003/0185325 A1 | 10/2003 | Wahl |
| 2006/0067453 A1 | 3/2006 | Duelk |
| 2007/0206510 A1 | 9/2007 | Morris et al. |
| 2011/0099410 A1 | 4/2011 | Mn et al. |

(Continued)

OTHER PUBLICATIONS

Extended European Search Report issued in European Patent Application No. 20186325.5, dated Jan. 12, 2021.

*Primary Examiner* — Jamal Javaid
(74) *Attorney, Agent, or Firm* — McDermott Will & Emery LLP

(57) ABSTRACT

A communication system comprising a master apparatus and a slave apparatus, wherein: the slave apparatus is configured, in an upstream period, to transmit a slave data signal to the master apparatus based on a slave clock signal; and the master apparatus is configured to: during reception of the slave data signal from the slave apparatus in the upstream period, extract timing information from the slave data signal and adjust a phase and/or frequency of a master clock signal or a definition thereof relative to a reference phase and/or frequency based on the extracted timing information to enable decoding of the received slave data signal based on the master clock signal or that definition; in a downstream period, transmit a master data signal to the slave apparatus based on the master clock signal according to the adjustment carried out during reception of the slave data signal in the upstream period; and adjust the phase and/or frequency of the master clock signal during transmission of the master data signal in the downstream period to reduce a change in the phase and/or frequency of the master clock signal effected according to the adjustment carried out during reception of the slave data signal in the upstream period.

17 Claims, 9 Drawing Sheets

(56) References Cited

U.S. PATENT DOCUMENTS

2014/0044133 A1\* 2/2014 Wang .................... H04J 3/0697
                                                        370/395.62
2014/0119250 A1   5/2014 Sorbara et al.
2019/0199508 A1\* 6/2019 Shinoda ................. H03L 7/197

\* cited by examiner

COMMUNICATION SYSTEMS, APPARATUSES AND METHODS

CROSS-REFERENCE OF RELATED APPLICATIONS

This application claims the benefit of European Patent Application 20186325.5, filed on Jul. 16, 2020, the entire disclosure of which Application is incorporated by reference herein.

The present invention relates to communication systems, apparatuses and methods, in particular to communication systems, apparatuses and methods using time division duplexing (TDD) communication.

In such communication systems, apparatuses and methods, one side (communication device or apparatus) transmits and the other side receives during e.g. "upstream" periods, and vice versa during e.g. "downstream" periods. Both sides operate in dependence upon respective clock signals and receive data from the other side based on those clock signals.

It has been found that existing such systems have shortcomings, for example relating to tolerance to phase and/or frequency drift and locking time, which have implications as to cost and accuracy of components, as explored in more detail later herein.

It is desirable to provide improved systems, apparatuses and methods in the light of the above.

According to an embodiment of a first aspect of the present invention, there is provided a communication system (time division duplex, TDD, system) comprising a master (primary) apparatus and a slave (secondary) apparatus, wherein: the slave apparatus is configured, in an upstream period, to transmit a slave data signal to the master apparatus based on a slave clock signal; and the master apparatus is configured to: during reception of the slave data signal from the slave apparatus in the upstream period, extract timing information from the slave data signal and adjust (adapt/adjust/update/configure/tune/shift/displace/track) a phase and/or frequency of a master clock signal or a definition (or descriptor) thereof relative to a reference phase and/or frequency based on the extracted timing information to enable decoding of the received slave data signal based on the master clock signal or that definition; in a downstream period (following the upstream period), transmit a master data signal to the slave apparatus based on the master clock signal according to (following) the adjustment carried out during reception of the slave data signal in the upstream period; and adjust the phase and/or frequency of the master clock signal during transmission of the master data signal in the downstream period to reduce a change (or difference) in the phase and/or frequency of the master clock signal effected according to (caused by) the adjustment carried out during reception of the slave data signal in the upstream period.

Such a communication system may enable the slave apparatus to receive the downstream data signal at an "expected" phase and/or frequency to reduce time taken for a slave clock signal to be aligned with the downstream data signal. Such a communication system may enable the overall timing of the system to be preserved (or "reset") e.g. at the end of the downstream period due to the adjustment of the phase and/or frequency of the master clock signal during transmission of the master data signal in the downstream period.

Said change in the phase and/or frequency of the master clock signal may be relative to the reference phase and/or frequency.

The master clock signal according/corresponding to the adjustment carried out during the reception of the slave data signal in the upstream period may be the master clock signal having its phase and/or frequency as adjusted to enable decoding of the received slave data signal (at the end of the relevant upstream period).

The change or difference in the phase and/or frequency of the master clock signal effected according to or caused by the adjustment carried out during reception of the slave data signal in the upstream period may be the difference in phase and/or frequency of the master clock signal between before and after that adjustment, assuming that the phase and/or frequency of the master clock signal itself was adjusted. For example, if the adjustment causes the phase and/or frequency to shift by a value +X (where + indicates a given direction), the change or difference (which could be expressed as an offset or displacement) is the value +X and this may be reduced by shifting (e.g. gradually) the phase and/or frequency by up to −X.

The master apparatus may be configured, in the downstream period, to adjust the phase and/or frequency of the master clock signal during transmission of the master data signal to counteract (completely compensate for) the change in the phase and/or frequency of the master clock signal according to (caused by) the adjustment carried out during reception of the slave data signal.

The master apparatus may be configured, in the downstream period, to adjust the phase and/or frequency of the master clock signal during transmission of the master data signal so that at the end of the transmission of the master data signal the phase and frequency of the master clock signal are (substantially) equal to the reference phase and reference frequency, respectively.

The master apparatus may be configured, in the downstream period, to adjust the phase and/or frequency of the master clock signal gradually, during transmission of the master data signal; and/or so that the adjustment is carried out over at least 20%, 50%, 90% or 100% of the transmission of the master data signal or of the downstream period.

The master apparatus may be configured, in the downstream period, to adjust the phase and/or frequency of the master clock signal during transmission of the master data signal to reduce (completely compensate for/counteract) a change in the phase and/or frequency of the master clock signal according to (caused by) an adjustment (or an average adjustment) of the phase and/or frequency of the master clock signal or the definition thereof carried out during reception of a plurality of said slave data signals in corresponding upstream periods (preceding the downstream period).

The master apparatus may be configured to obtain a measure of the change in the phase and/or frequency of the master clock signal as the phase and/or frequency of the master clock signal or the definition thereof is adjusted during reception of the slave data signal in the upstream period, that measure indicative of a relative drift in phase and/or frequency of the slave clock signal, that relative drift being a drift relative to the reference phase and/or frequency.

The master apparatus may be configured to obtain the measure of the change in the phase and/or frequency of the master clock signal by measuring the change in the phase and/or frequency of the master clock signal or the definition thereof as the phase and/or frequency of the master clock signal or the definition thereof is adjusted during reception of the slave data signal in the upstream period.

The slave apparatus may be configured to, during reception of the master data signal from the master apparatus in the downstream period, extract timing information from the master data signal and adjust the phase and/or frequency of the slave clock signal or a definition thereof based on that extracted timing information to enable decoding of the received master data signal based on the slave clock signal or that definition.

The master apparatus may be configured to: for (before) reception of the slave data signal in the upstream period, shift the phase of the master clock signal or the definition thereof by an amount according to (by an amount proportional to/by an amount equivalent to an integer multiple of) an expected propagation delay between the master and slave apparatuses (an expected propagation delay of the slave data signal) to reduce a phase difference between a phase of the master clock signal or the definition thereof before that shift and a phase of the master clock signal suitable for decoding the slave data signal as received by the master apparatus; and/or for (before) transmission of the master data signal in the downstream period, shift the phase of the master clock signal by an amount according to (by an amount proportional to/by an amount equivalent to an integer multiple of) an expected propagation delay between the master and slave apparatuses (an expected propagation delay of the slave data signal and the master data signal) to reduce a phase difference between a phase of the master clock signal before that shift and a phase of the master clock signal which causes the phase of the slave clock signal to be suitable for decoding the master data signal as received by the slave apparatus.

The slave apparatus may be configured to: for (before) transmission of the slave data signal in the upstream period, shift the phase of the slave clock signal by an amount according to (by an amount proportional to/by an amount equivalent to an integer multiple of) an expected propagation delay between the master and slave apparatuses (an expected propagation delay of the slave data signal) to reduce a phase difference between a phase of the slave clock signal before that shift and a phase of the slave clock signal which causes the phase of the master clock signal to be suitable for decoding the slave data signal as received by the master apparatus; and/or for (before) reception of the master data signal in the downstream period, shift the phase of the slave clock signal or a definition thereof by an amount according to (by an amount proportional to/by an amount equivalent to an integer multiple of) an expected propagation delay between the master and slave apparatuses (an expected propagation delay of the slave data signal and the master data signal) to reduce a phase difference between a phase of the slave clock signal or the definition thereof before that shift and a phase of the slave clock signal suitable for decoding the master data signal as received by the slave apparatus.

The master apparatus may be configured to, for (before) reception of the slave data signal in the upstream period, shift the phase of the master clock signal or the definition thereof by an amount equivalent to an expected propagation delay between the master and slave apparatuses, and the slave apparatus may be configured to, for (before) transmission of the slave data signal in the upstream period, shift the phase of the slave clock signal by an amount equivalent to the expected propagation delay between the master and slave apparatuses and in a direction opposite to the shift of the phase of the master clock signal or the definition thereof, the shift of the phase of the master clock signal or the definition thereof and the shift of the phase of the slave clock signal being to reduce a phase difference between a phase of the master clock signal or the definition thereof before the shift of the phase of the master clock signal or the definition thereof and a phase of the slave data signal as received by the master apparatus.

The master apparatus may be configured to, for (before) reception of the slave data signal in the upstream period, shift the phase of the master clock signal or the definition thereof by an amount equivalent to twice the expected propagation delay between the master and slave apparatuses to reduce a phase difference between a phase of the master clock signal or the definition thereof before that shift and a phase of the master clock signal suitable for decoding the slave data signal as received by the master apparatus.

The slave apparatus may be configured to, for (before) transmission of the slave data signal in the upstream period, shift the phase of the slave clock signal by an amount equivalent to twice the expected propagation delay between the master and slave apparatuses to reduce a phase difference between a phase of the slave clock signal before that shift and a phase of the slave clock signal which causes the phase of the master clock signal to be suitable for decoding the slave data signal as received by the master apparatus.

The master apparatus may be configured to, for (before) transmission of the master data signal in the downstream period, shift the phase of the master clock signal by an amount equivalent to an expected propagation delay between the master and slave apparatuses, and the slave apparatus may be configured to, for (before) reception of the master data signal in the downstream period, shift the phase of the slave clock signal or a definition thereof by an amount equivalent to the expected propagation delay between the master and slave apparatuses and in a direction opposite to the shift of the phase of the master clock signal, the shift of the phase of the master clock signal and the shift of the phase of the slave clock signal or the definition thereof being to reduce a phase difference between a phase of the slave clock signal or the definition thereof before the shift of the phase of the slave clock signal or the definition thereof and a phase of the master data signal as received by the slave apparatus.

The master apparatus may be configured to, for (before) transmission of the master data signal in the downstream period, shift the phase of the master clock signal by an amount equivalent to twice the expected propagation delay between the master and slave apparatuses to reduce a phase difference between a phase of the master clock signal before that shift and a phase of the master clock signal which causes the phase of the slave clock signal to be suitable for decoding the master data signal as received by the slave apparatus.

The slave apparatus may be configured to, for (before) reception of the master data signal in the downstream period, shift the phase of the slave clock signal or a definition thereof by an amount equivalent to twice the expected propagation delay between the master and slave apparatuses to reduce a phase difference between a phase of the slave clock signal or the definition thereof before that shift and a phase of the slave clock signal suitable for decoding the master data signal as received by the slave apparatus.

The term "suitable" can be understood as follows: a clock signal (slave/master) is suitable for receiving a data signal (master/slave) when the phase and/or frequency of the clock signal after the shift in phase of the clock signal is closer to the phase and/or frequency of the (clock component of the) data signal (as it is received) than it was before the shift in phase, and optionally when the phase and/or frequency of the clock signal after the shift is aligned with or substantially the same as the phase and/or frequency of the (clock component of the) data signal (as it is received).

In some instances the shift in phase could be a shift in phase and/or frequency.

The master apparatus may be configured, in a prior downstream period (preceding the upstream period), to transmit to the slave apparatus a prior master data signal based on the master clock signal, prior to reception of the slave data signal in the upstream period; and the slave apparatus may be configured to: during reception of the prior master data signal from the master apparatus in the prior downstream period, extract timing information from the prior master data signal and adjust the phase and/or frequency of the slave clock signal or a definition thereof based on that extracted timing information to enable decoding of the received prior master data signal based on the slave clock signal; and in the upstream period, transmit the slave data signal based on the slave clock signal according to (following) the adjustment carried out during reception of the prior master data signal.

The master apparatus may be configured to transmit the prior master data signal based on the master clock signal having substantially the reference phase and/or frequency.

The master apparatus may comprise a reference clock signal generator configured to generate a reference clock signal having the reference phase and/or frequency.

The master apparatus may be configured to receive a reference clock signal having the reference phase and/or frequency from circuitry external to the master apparatus.

The master apparatus may comprise a master clock recovery unit configured to extract the timing information from the slave data signal and adjust the phase and/or frequency of the master clock signal or the definition thereof.

The master clock recovery unit may comprise a master clock signal generator configured to generate the master clock signal based on the reference clock signal and based on the timing information extracted from the slave data signal.

The reference clock signal generator may be a master phase-locked loop (PLL).

The master clock recovery unit may be a master clock and data recovery (CDR) unit.

The slave apparatus may comprise a local clock signal generator configured to generate a local clock signal and a slave clock recovery unit configured to extract the timing information from the master data signal and/or the prior master data signal.

The slave clock recovery unit may comprise a slave clock signal generator configured to generate the slave clock signal based on the local clock signal and the timing information extracted from the master data signal or the prior master data signal.

The local clock signal generator may be a slave phase-locked loop (PLL).

The slave clock recovery unit may be a slave clock and data recovery (CDR) unit.

According to an embodiment of a second aspect of the present invention, there is provided a method of communication in a communication system (time division duplex, TDD, system) comprising a master (primary) apparatus and a slave (secondary) apparatus, the method comprising: by the slave apparatus, in an upstream period, transmitting to the master apparatus a slave data signal based on a slave clock signal; and by the master apparatus: during reception of the slave data signal from the slave apparatus in the upstream period, extracting timing information from the slave data signal and adjusting (adapting/adjusting/updating/configuring/tuning/shifting/displacing/tracking) a phase and/or frequency of a master clock signal or a definition (or descriptor) thereof relative to a reference phase and/or frequency based on the extracted timing information to enable decoding of the received slave data signal based on the master clock signal or that definition; in a downstream period (following the upstream period), transmitting a master data signal to the slave apparatus based on the master clock signal according to (following) the adjustment carried out during reception of the slave data signal in the upstream period; and adjusting the phase and/or frequency of the master clock signal during transmission of the master data signal in the downstream period, to reduce a change (difference) in the phase and/or frequency of the master clock signal effected according to (caused by) the adjustment carried out during reception of the slave data signal in the upstream period.

According to an embodiment of a third aspect of the present invention, there is provided a time division duplex, TDD, system (or a communication system) comprising a master (primary) apparatus and a slave (secondary) apparatus, wherein: the slave apparatus is configured, in an upstream period, to transmit a slave data signal to the master apparatus based on a slave clock signal; and the master apparatus is configured to: during reception of the slave data signal from the slave apparatus in the upstream period, adjust (adapt/adjust/update/configure/tune/shift/displace/track) a phase and/or frequency of a master clock signal or a definition (or descriptor) thereof relative to a reference phase and/or frequency based on pre-stored drift information to enable decoding of the received slave data signal based on the master clock signal or that definition, the pre-stored drift information relating to a relative drift in phase and/or frequency of the slave clock signal, that relative drift being relative to the reference phase and/or frequency; in a downstream period (following the upstream period), transmit a master data signal to the slave apparatus based on the master clock signal according to (following) the adjustment carried out during reception of the slave data signal in the upstream period; and adjust the phase and/or frequency of the master clock signal during transmission of the master data signal in the downstream period to reduce a change (difference) in the phase and/or frequency of the master clock signal effected according to (caused by) the adjustment carried out during reception of the slave data signal in the upstream period.

According to an embodiment of a fourth aspect of the present invention, there is provided a communication device (master apparatus) for use as a master apparatus in a communication system (time division duplex, TDD, system) comprising the master apparatus and a slave apparatus, the communication device configured to: in an upstream period, receive a slave data signal from the slave apparatus and, during reception of the slave data signal from the slave apparatus in the upstream period, extract timing information from the slave data signal and adjust (adapt/adjust/update/configure/tune/shift/displace/track) a phase and/or frequency of a master clock signal or a definition (or descriptor) thereof relative to a reference phase and/or frequency based on the extracted timing information to enable decoding of the received slave data signal based on the master clock signal or that definition; in a downstream period (following the upstream period), transmit a master data signal to the slave apparatus based on the master clock signal according to (following) the adjustment carried out during reception of the slave data signal in the upstream period; and adjust the phase and/or frequency of the master clock signal during transmission of the master data signal in the downstream period to reduce a change (difference) in the phase and/or frequency of the master clock signal effected according to (caused by) the adjustment carried out during reception of the slave data signal in the upstream period.

According to an embodiment of a fifth aspect of the present invention, there is provided a control unit for use in a communication device (master apparatus), the communication device being for use as a master apparatus in a communication system (time division duplex, TDD, system) comprising the master apparatus and a slave apparatus in which the communication device is configured to: in an upstream period, receive a slave data signal from the slave apparatus and, during reception of the slave data signal from the slave apparatus in the upstream period, extract timing information from the slave data signal and adjust (adapt/adjust/update/configure/tune/shift/displace/track) a phase and/or frequency of a master clock signal or a definition (or descriptor) thereof relative to a reference phase and/or frequency based on the extracted timing information to enable decoding of the received slave data signal based on the master clock signal or that definition; and in a downstream period (following the upstream period), transmit a master data signal to the slave apparatus based on the master clock signal according to (following) the adjustment carried out during reception of the slave data signal in the upstream period, wherein the control unit is configured to adjust the phase and/or frequency of the master clock signal during transmission of the master data signal in the downstream period to reduce a change (difference) in the phase and/or frequency of the master clock signal effected according to (caused by) the adjustment carried out during reception of the slave data signal in the upstream period.

According to an embodiment of a sixth aspect of the present invention, there is provided a computer program configured to be executed by a control unit for use in a master apparatus (communication device), the master apparatus being for use in a time division duplex, TDD, system (or a communication system) comprising the master apparatus and a slave apparatus in which the master apparatus is configured to: in an upstream period, receive a slave data signal from the slave apparatus and, during reception of the slave data signal from the slave apparatus in the upstream period, extract timing information from the slave data signal and adjust (adapt/adjust/update/configure/tune/shift/displace/track) a phase and/or frequency of a master clock signal or a definition (or descriptor) thereof relative to a reference phase and/or frequency based on the extracted timing information to enable decoding of the received slave data signal based on the master clock signal; and in a downstream period (following the upstream period), transmit a master data signal to the slave apparatus based on the master clock signal according to (following) the adjustment carried out during reception of the slave data signal in the upstream period, wherein the computer program, when executed, causes the control unit to adjust the phase and/or frequency of the master clock signal during transmission of the master data signal in the downstream period to reduce a change (difference) in the phase and/or frequency of the master clock signal effected according to (caused by) the adjustment carried out during reception of the slave data signal in the upstream period.

According to an embodiment of a seventh aspect of the present invention, there is provided a method of communication carried out by a communication device (master apparatus) in a communication system (time division duplex, TDD, system) comprising the master apparatus and a slave apparatus, the method comprising: in an upstream period, receiving a slave data signal from the slave apparatus and, during reception of the slave data signal from the slave apparatus in the upstream period, extracting timing information from the slave data signal and adjusting (adapting/adjusting/updating/configuring/tuning/shifting/displacing/tracking) the phase and/or frequency of a master clock signal or a definition (or descriptor) thereof relative to a reference phase and/or frequency based on the extracted timing information to enable decoding of the received slave data signal based on the master clock signal or that definition; in a downstream period (following the upstream period), transmitting a master data signal to the slave apparatus based on the master clock signal according to (following) the adjustment carried out during reception of the slave data signal in the upstream period; and adjusting the phase and/or frequency of the master clock signal during transmission of the master data signal in the downstream period to reduce a change (difference) in phase and/or frequency of the master clock signal effected according to (caused by) the adjustment carried out during reception of the slave data signal in the upstream period.

According to an embodiment of an eighth aspect of the present invention, there is provided a master apparatus (communication device) for use in a time division duplex, TDD, system (or a communication system) comprising the master apparatus and a slave apparatus, the master apparatus configured to: in an upstream period, receive a slave data signal from the slave apparatus and, during reception of the slave data signal from the slave apparatus in the upstream period, adjust (adapt/adjust/update/configure/tune/shift/displace/track) the phase and/or frequency of a master clock signal or a definition (or descriptor) thereof relative to a reference phase and/or frequency based on pre-stored drift information to enable decoding of the received slave data signal based on the master clock signal or that definition, the pre-stored drift information relating to a relative drift in phase and/or frequency of the slave clock signal, that relative drift being relative to the reference phase and/or frequency; in a downstream period (following the upstream period), transmit a master data signal to the slave apparatus based on the master clock signal according to (following) the adjustment carried out during reception of the slave data signal in the upstream period; and adjust the phase and/or frequency of the master clock signal during transmission of the master data signal in the downstream period to reduce a change (difference) in the phase and/or frequency of the master clock signal effected according to (caused by) the adjustment carried out during reception of the slave data signal in the upstream period.

According to an embodiment of a ninth aspect of the present invention, there is provided a time division duplex, TDD, system (or a communication system) comprising a master apparatus and a slave apparatus, wherein: the master apparatus is configured to: in a first downstream period, transmit a first master data signal to the slave apparatus based on a master clock signal; during reception of a slave data signal from the slave apparatus in an upstream period (following the first downstream period), extract timing information from the slave data signal and adjust (adapt/adjust/update/configure/tune/shift/displace/track) a phase and/or frequency of the master clock signal or a definition (or descriptor) thereof relative to a reference phase and/or frequency based on the extracted timing information to enable decoding of the received slave data signal based on the master clock signal or that definition; and in a second downstream period (following the upstream period), transmit to the slave apparatus a second master data signal based on the master clock signal according to (following) the adjustment carried out during reception of the slave data signal in the upstream period; and the slave apparatus is configured to: during reception of the first master data signal from the master apparatus in the first downstream period, extract timing information from the first master data signal and adjust (adapt/adjust/update/configure/tune/shift/displace/track) a phase and/or frequency of a slave clock signal or a definition (or descriptor) thereof based on the extracted timing information to enable decoding of the received first master data signal based on the slave clock signal or that definition; and in the upstream period, transmit the slave data signal to the master apparatus based on the slave clock signal according to (following) the adjustment carried out during reception of the first master data signal in the first downstream period.

The master apparatus may be configured to: for (before) reception of the slave data signal in the upstream period, shift the phase of the master clock signal or the definition thereof by an amount according to (by an amount proportional to/by an amount equivalent to an integer multiple of) an expected propagation delay between the master and slave apparatuses (an expected propagation delay of the first master data signal and the slave data signal) to reduce a phase difference between a phase of the master clock signal or the definition thereof before that shift and a phase of the master clock signal suitable for decoding the slave data signal as received by the master apparatus; and/or for (before) transmission of the second master data signal in the second downstream period, shift the phase of the master clock signal by an amount according to (by an amount proportional to/by an amount equivalent to an integer multiple of) an expected propagation delay between the master and slave apparatuses (an expected propagation delay of the slave data signal and the second master data signal) to reduce a phase difference between a phase of the master clock signal before that shift and a phase of the master clock signal which causes the phase of the slave clock signal to be suitable for decoding the second master data signal as received by the slave apparatus.

The slave apparatus may be configured to: for (before) transmission of the slave data signal in the upstream period, shift the phase of the slave clock signal by an amount according to (by an amount proportional to/by an amount equivalent to an integer multiple of) an expected propagation delay between the master and slave apparatuses (an expected propagation delay of the first master data signal and the slave data signal) to reduce a phase difference between a phase of the slave clock signal before that shift and a phase of the slave clock signal which causes the phase of the master clock signal to be suitable for decoding the slave data signal as received by the master apparatus; and/or for (before) reception of the second master data signal in the second downstream period, shift the phase of the slave clock signal or a definition thereof by an amount according to (by an amount proportional to/by an amount equivalent to an integer multiple of) an expected propagation delay between the master and slave apparatuses (an expected propagation delay of the slave data signal and the second master data signal) to reduce a phase difference between a phase of the slave clock signal or the definition thereof before that shift and a phase of the slave clock signal suitable for decoding the second master data signal as received by the slave apparatus.

Any features relating to "shifting" and recited as part of the first aspect a phase apply to the ninth aspect equally.

The slave apparatus may be configured to, during reception of the second master data signal from the master apparatus in the second downstream period, extract timing information from the second master data signal and adjust (adapt/adjust/update/configure/tune/shift/displace/track) the phase and/or frequency of the slave clock signal or a definition thereof based on the extracted timing information to enable decoding of the received second master data signal based on the slave clock signal.

According to an embodiment of a tenth aspect of the present invention, there is provided a master apparatus for use in a time division duplex, TDD, system comprising the master apparatus and a slave apparatus, the master apparatus configured to: in an upstream period, receive a slave data signal from the slave apparatus and, during reception of the slave data signal from the slave apparatus in the upstream period, extract timing information from the slave data signal and adjust (adapt/adjust/update/configure/tune/shift/displace/track) the phase and/or frequency of a master clock signal or a definition (or descriptor) thereof relative to a reference phase and/or frequency based on the extracted timing information to enable decoding of the received slave data signal based on the master clock signal or that definition; in a downstream period (following the upstream period), transmit a master data signal to the slave apparatus based on the master clock signal according to (following) the adjustment carried out during reception of the slave data signal in the upstream period; and for (before) transmission of the master data signal in the downstream period, shift the phase of the master clock signal by an amount according to (by an amount proportional to/by an amount equivalent to an integer multiple of) an expected propagation delay between the master and slave apparatuses (an expected propagation delay of the slave data signal and the master data signal) to reduce a phase difference between a phase of the master clock signal before that shift and a phase of the master clock signal which causes a phase of a slave clock signal used by the slave apparatus to be suitable for decoding the master data signal.

Features of any of the above first to tenth aspects apply equally to any of the other first to tenth aspects.

Reference will now be made, by way of example, to the accompanying drawings, of which:

FIG. 1 is a schematic diagram of a communication system 101 as a comparative example.

Figure 1:
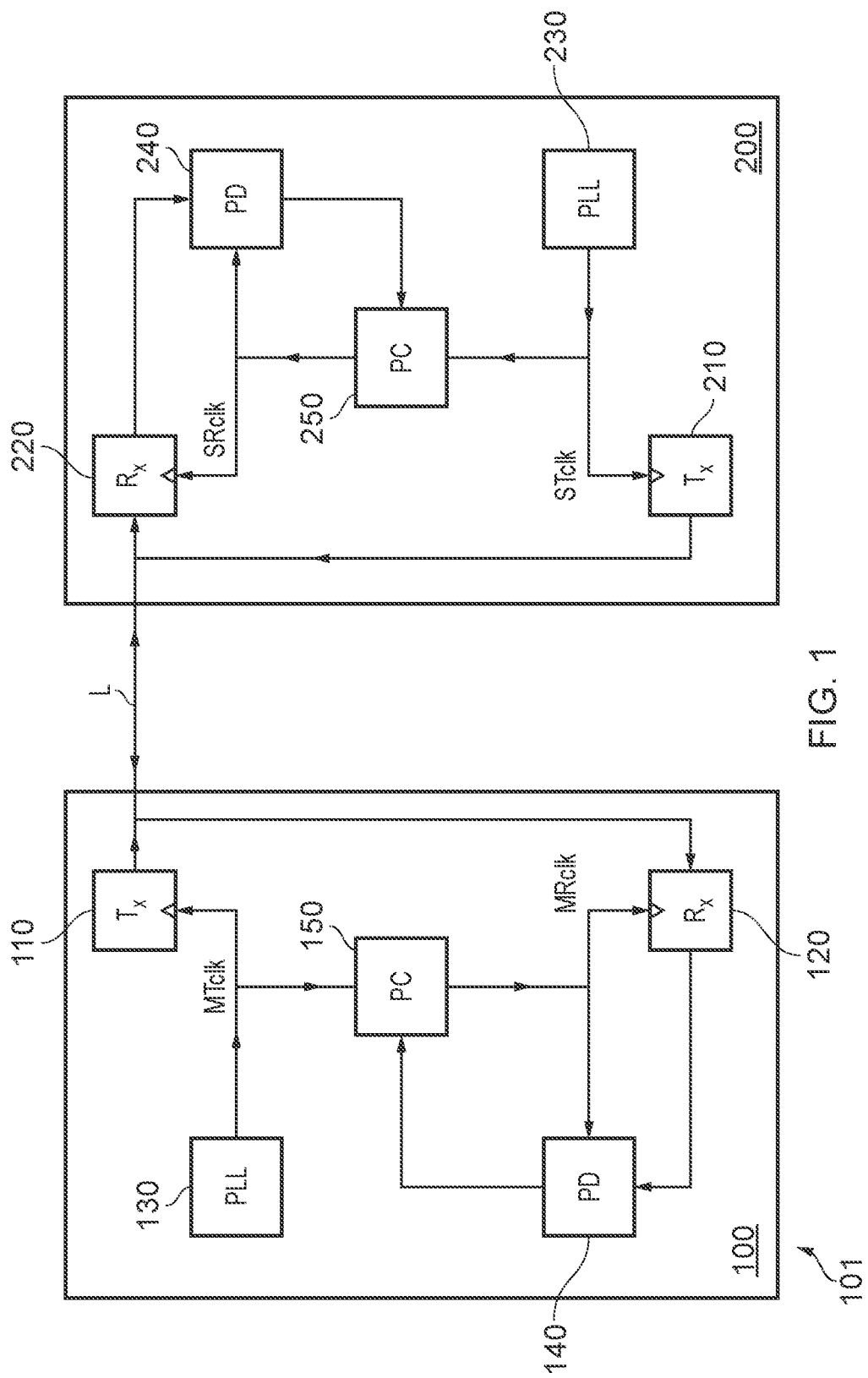
FIG. 1 is a schematic diagram of a communication system as a comparative example.

Communication system 101 comprises a master (first, or primary) apparatus 100 and a slave (second, or secondary) apparatus 200. Both apparatuses may be referred to as communication devices. The master and slave apparatuses 100 and 200 are configured to communicate with each other using time division duplexing (TDD) via the link L (any wired or wireless transmission medium). During downstream (downlink) periods the master apparatus 100 transmits data to the slave apparatus 200 and during upstream (uplink) periods the slave apparatus 200 transmits data to the master apparatus 100. The system 101 may be configured to operate with alternating downstream and upstream periods, optionally separated by interburst gaps (IBG) in which neither the master apparatus 100 nor the slave apparatus 200 transmits data.

The master apparatus 100 comprises a transmitting unit 110, a receiving unit 120, a phase-locked loop (PLL) 130, a phase detector (PD) 140 and a phase controller (PC) 150. The slave apparatus 200 comprises a transmitting unit 210, a receiving unit 220, a PLL 230, a phase detector (PD) 240 and a phase controller (PC) 250, which operate in a similar way to the corresponding units in the master apparatus 100. Although not shown, the transmitting units 110 and 210 may have data inputs configured to receive data which is to be transmitted via signal line L, or may generate such data internally. Further, the signal line L is shown as a single two-way signal line, but separate paths for each direction could be used.

The PLL 130 is configured to generate a (master transmission, MT) clock signal MTclk. The transmitting unit 110 is configured to transmit a downstream data signal to the slave apparatus 200 according to the clock signal MTclk. That is, the transmitting unit 110 is clocked by the clock signal MTclk so that the downstream data signal is synchronized with that clock signal. The PLL 230 is configured to generate a (slave transmission, ST) clock signal STclk. The transmitting unit 210 is configured to transmit an upstream data signal to the master apparatus 100 according to the clock signal STclk generated by the PLL 230. That is, the transmitting unit 210 is clocked by the clock signal STclk so that the upstream data signal is synchronized with that clock signal.

The phase detector 140 and the phase controller 150 are configured to together extract timing information from an upstream data signal received from the slave apparatus 200 and adjust a phase and/or frequency of (or derived from) the clock signal MTclk to produce a (master reception, MR) clock signal MRclk. The phase and/or frequency of the clock signal MRclk is (continually) adjusted as necessary during upstream periods, based on the extracted timing information, to "track" clock information embodied by the upstream data signal (i.e. effectively to track a change in phase/frequency of the clock signal STclk output by the PLL 230 and used to transmit the upstream data signal, which may include changes due to delays in the transmission medium or link L). The receiving unit 120 is configured to receive a slave data signal from the slave apparatus 200 according to the clock signal MRclk.

Similarly, the receiving unit 220 is configured to receive a downstream data signal from the master apparatus 100 according to a (slave reception, SR) clock signal SRclk produced by the phase detector 240 and the phase controller 250 based on timing information extracted from the downstream data signal received from the master apparatus 100. The phase and/or frequency of the clock signal SRclk is thus (continually) adjusted as necessary during downstream periods, based on the extracted timing information, to "track" clock information embodied by the downstream data signal (i.e. effectively to track a change in phase/frequency of the clock signal MTclk used to transmit the downstream data signal, which may include changes due to delays in the transmission medium or link L).

For each of the master and slave apparatuses 100, 200, its PLL may be considered a clock generator, and, similarly, the combination of its PLL, PD and PC may also be considered a clock generator. For each of the master and slave apparatuses 100, 200, its receiving unit, PD and PC may be considered a clock and data recovery (CDR) unit configured to recover a clock signal and data and/or track the clock signal. For each of the master and slave apparatuses 100, 200, its receiving unit, PD and PC may be considered a clock recovery (CR) unit configured to recover a clock signal but not necessarily the data.

Figure 2:
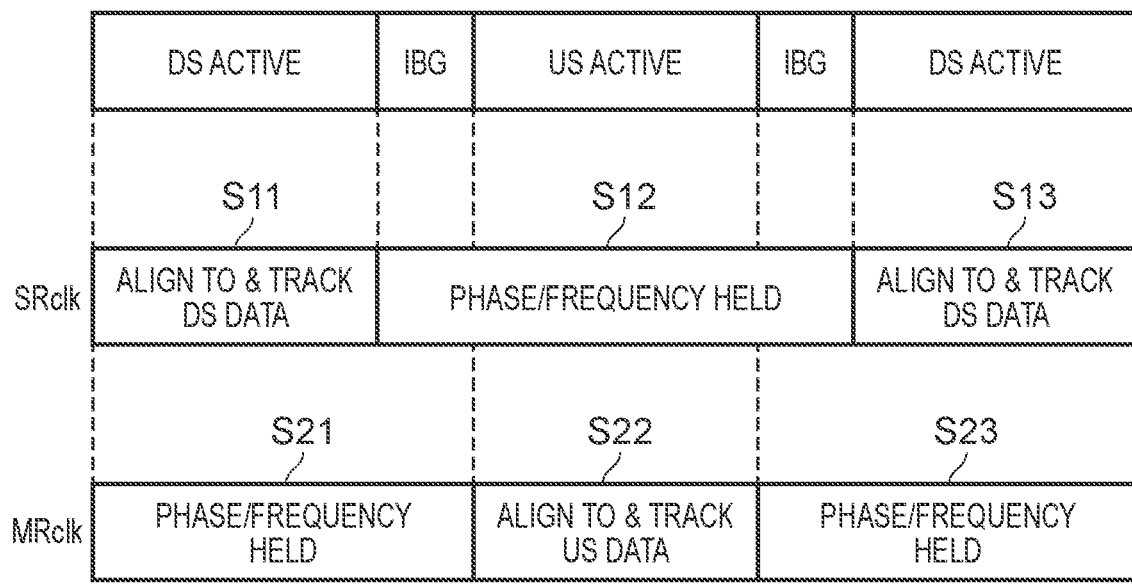
FIG. 2 is a timing diagram useful for understanding FIG. 1.

FIG. 2 is a timing diagram useful for understanding the communication system 101. FIG. 2 shows at steps S11 to S13 how the clock signal SRclk is controlled by the phase detector 240 and the phase controller 250, and shows at steps S21 to S23 how the clock signal MRclk is controlled by the phase detector 140 and the phase controller 150.

According to FIG. 2, at step S11 during a first downstream period (DS ACTIVE) when the downstream transmission is active (i.e. when the master apparatus 100 transmits to the slave apparatus 200), the clock signal SRclk is aligned to the downstream data signal (data received from the master apparatus 100) and tracks the downstream data signal. That is, the phase/frequency of the clock signal SRclk is adjusted so that the downstream data signal can be decoded based on the clock signal SRclk. At step S12, during a first interburst gap (IBG), in which neither the master apparatus 100 nor the slave apparatus 200 transmits data, during an upstream period (US ACTIVE) when the upstream transmission is active (i.e. when the slave apparatus 200 transmits to the master apparatus 100), and during a second IBG, the phase and frequency of the clock signal SRclk are held, i.e. are not "actively" adjusted (however, the phase/frequency of the clock signal SRclk may change due to "drift" in the PLL 230). At step S13, during a second downstream period, the clock signal SRclk is again aligned to the downstream data signal and tracks the downstream data signal. "Drift" in this sense is any misalignment or change of the phase or frequency of the PLLs 130 and 230 relative to each other or relative to a reference phase and/or frequency. Drift is described in more detail below with reference to FIG. 5.

At step S21, during the first downstream period and during the first IBG, the phase and frequency of the clock signal MRclk are held (however the phase and/or frequency of the clock signal MRclk may change due to "drift" in the PLL 130). At step S22, during the upstream period, the clock signal MRclk is aligned to the upstream data signal and tracks the upstream data signal. At step S23, during the second IBG and during the second downstream period, the phase and frequency of the clock signal MRclk are held (however the phase and/or frequency of the clock signal MRclk may change due to "drift" in the PLL 130).

Therefore, in the communication system 101, each of the master and slave apparatuses 100 and 200 is configured to transmit using a local PLL (i.e. according to the clock signals MTclk and STclk, respectively) and receive using a local phase detector and a phase controller operating in conjunction with their local PLL (i.e. according to the adjusted or tracking clock signals MRclk and SRclk, respectively).

Note that the term "phase/frequency" is used herein when referring to drift or adjustment. This is because the drift/adjustment may be a (e.g. static) drift/adjustment in phase alone and not frequency, or the drift/adjustment may be a drift/adjustment in frequency which consequently gives rise to a (varying) phase drift/adjustment. The drift/adjustment may be such that only a drift in the frequency is measured and only the frequency is adjusted, even though such a frequency drift/adjustment will give rise to a corresponding phase drift/adjustment. Such drift/adjustment may change dynamically. The term phase/frequency will be understood accordingly to mean "phase and/or frequency", or "phase or phase and frequency".

Figure 3:
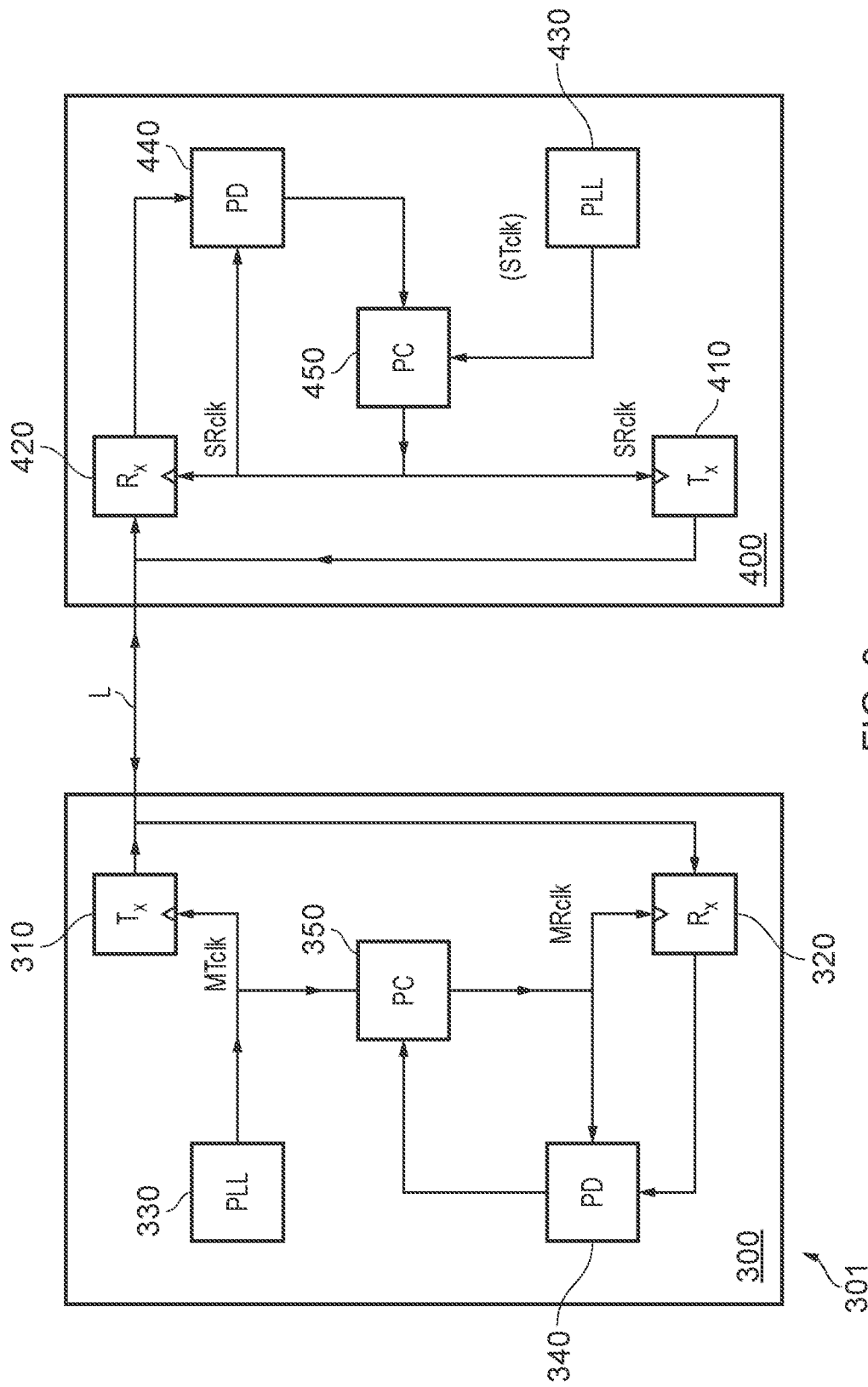
FIG. 3 is a schematic diagram of a communication system as a comparative example.

FIG. 3 is a schematic diagram of a communication system 301 as another comparative example. Communication system 301 is similar to communication system 101 and the differences compared to communication system 101 will be described.

Communication system 301 comprises a master apparatus 300 and a slave apparatus 400. Master apparatus 300 is the same as the master apparatus 100 illustrated in FIG. 1 and corresponding reference numerals have been used (i.e. starting with a "3" rather than a "1"). Master apparatus 300 operates in the same way as master apparatus 100.

Slave apparatus 400 is similar to slave apparatus 200 and corresponding reference numerals have been used (i.e. starting with a "4" rather than a "2"). However, whereas the slave apparatus 200 is configured to transmit data according to the clock signal STclk generated by the PLL 230 (i.e. with no adjustment), the slave apparatus 400 is configured to transmit data according to the clock signal SRclk (i.e. looking back to FIGS. 1 and 2, the clock signal SRclk after adjustment of its phase/frequency during the preceding downstream period). The clock signal STclk has been indicated on FIG. 3 in brackets for comparison with FIG. 1, but is not directly used for transmission in FIG. 3.

Figure 4:
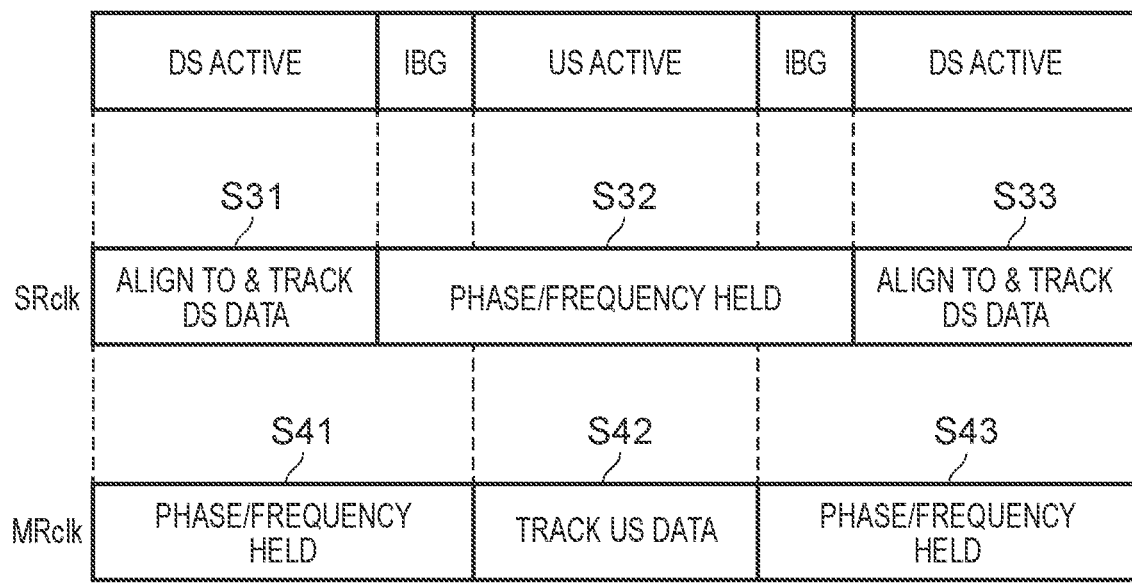
FIG. 4 is a timing diagram useful for understanding FIG. 3.

FIG. 4 is a timing diagram useful for understanding the communication system 301, and may be compared with the timing diagram of FIG. 2. FIG. 4 shows at steps S31 to S33 how the clock signal SRclk is controlled by the phase detector 440 and the phase controller 450, and shows at steps S41 to S43 how the clock signal MRclk is controlled by the phase detector 340 and the phase controller 350.

FIG. 4 is similar to FIG. 2, and steps S31 to S33, S41 and S43 are the same as steps S11 to S13, S21 and S23, respectively. However, in step S42 of FIG. 4, the clock signal MRclk tracks the upstream data signal, rather than (as in step S22 of FIG. 2) aligning to the upstream data signal as well as tracking the upstream data signal. This difference in FIG. 4 compared to FIG. 2 reflects the fact that in the communication system 301 the upstream data signal is transmitted (for step S42) from the slave apparatus 400 during the corresponding upstream period using the clock signal SRclk which has been adjusted during the preceding downstream period according to the downstream data signal (which was transmitted for step S31) to have the same phase/frequency as the clock signal MTclk according to which the downstream data was transmitted. Therefore little (if any) alignment of the clock signal MTclk is required to produce the clock signal MRclk.

In this sense, the clock signal MRclk can simply be the same as (or closely similar to) the clock signal MTclk at the start of the upstream period, and then the clock signal MRclk need only be adjusted as the upstream data is tracked (i.e. to track the change in phase/frequency of the clock signal SRclk used to transmit the upstream data signal due to the drift in phase/frequency of the clock signal (STclk) output by the PLL 430 and used to transmit the upstream data signal).

This, however, is a simplification. In practice, the clock signal MRclk may be shifted in step S42 initially relative to the clock signal MTclk to account for "cable delay" (a phase delay—or a e.g. static phase offset relative to the clock signal MTclk—arising due to the transmission of the upstream data, which may be incurred over the wired or wireless transmission medium of link L) and also adjusted to account for the drift of the PLL 430 (i.e. drift in phase/ frequency of the clock signal STclk output by the PLL 430) during the IBG immediately preceding the upstream period of step S42. However, the cable delay (which may also be referred to as propagation delay) may manifest itself (at least, on average) as a known/measured phase shift. Further, the adjustment to account for the drift of the PLL 430 during the IBG in communication system 301 may be small compared to the adjustment of the clock signal MTclk to produce the clock signal MRclk aligned with the upstream data (i.e. clock signal SRclk) in step S22 of FIG. 2. In other words, a typical system is designed so that the drift (of the PLL 430 during the IBG) may be small compared to the maximum phase shift that can be accounted for during alignment (i.e. adjustment) of the clock signal MRclk with the upstream data signal.

Figure 5:
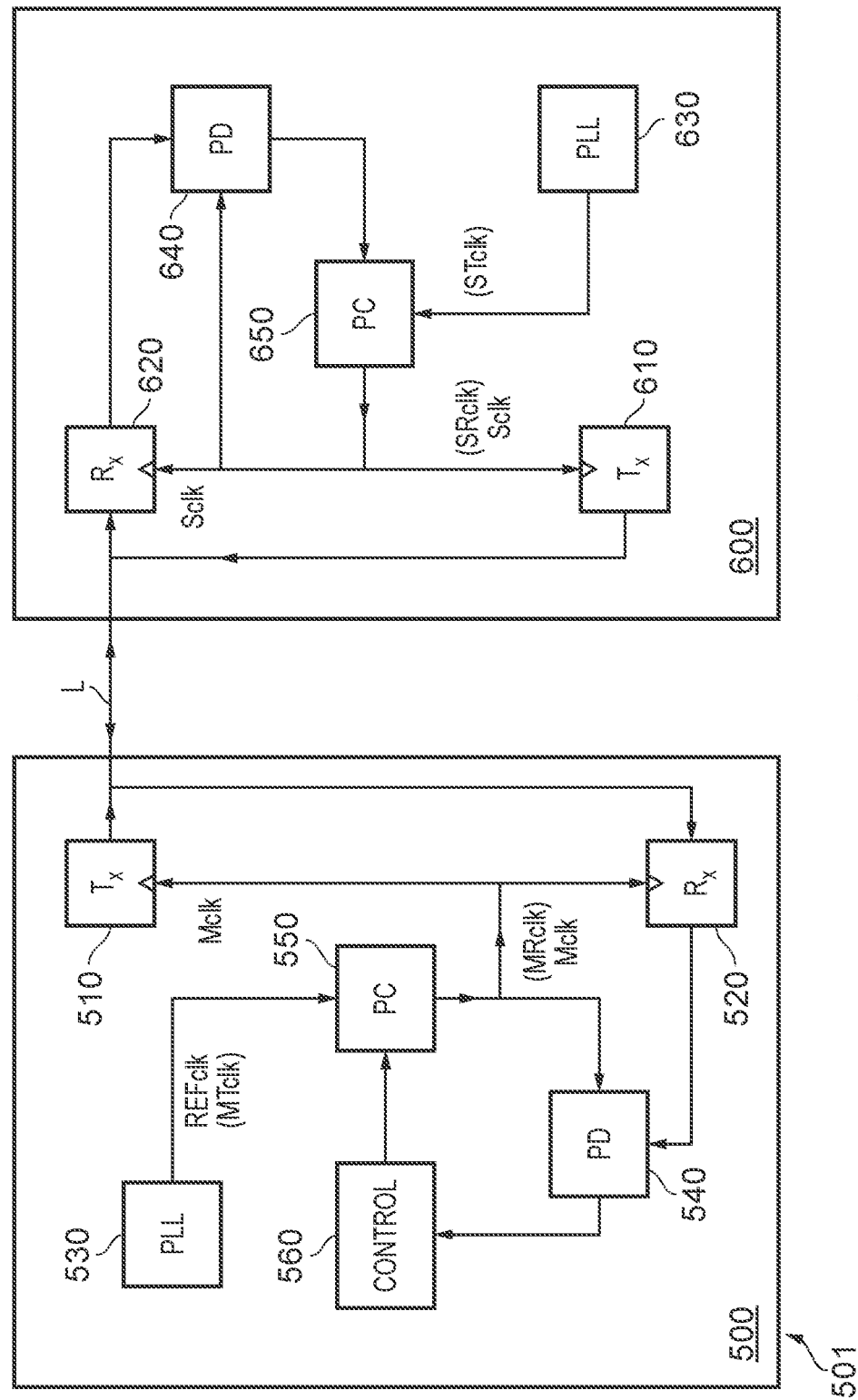
FIG. 5 is a schematic diagram of a communication system embodying the present invention.

FIG. 5 is a schematic diagram of a communication system 501, embodying the present invention.

Communication system 501 comprises a master apparatus 500 and a slave apparatus 600. As before, both apparatuses may be referred to as communication devices. The master and slave apparatuses 500 and 600 are configured to communicate with each other using time division duplexing (TDD) via the link L. As with the communication systems 101 and 301, during downstream periods the master apparatus 500 transmits data to the slave apparatus 600 and during upstream periods the slave apparatus 600 transmits data to the master apparatus 500.

In overview, the master apparatus 500 is configured to receive a slave data signal (upstream data signal) from the slave apparatus 600 during an upstream period and, during reception of the slave data signal from the slave apparatus 600, extract timing information from the slave data signal and adjust (adapt/adjust/update/configure/tune) the phase/ frequency of a master clock signal Mclk relative to a reference phase/frequency of a reference clock signal REFclk based on the extracted timing information to enable decoding of the received slave data signal based on the master clock signal Mclk. The master apparatus 500 is configured to then transmit a master data signal (downstream data signal) to the slave apparatus 600 during a downstream period (following the upstream period) based on the master clock signal Mclk following the adjustment carried out in the preceding upstream period during reception of the slave data signal. The master apparatus 500 is configured to then adjust the phase/frequency of the master clock signal Mclk during transmission of that master data signal to reduce a change (difference) in the phase/frequency of the master clock signal Mclk caused by the adjustment carried out during reception of the slave data signal.

In detail, the master apparatus 500 comprises a transmitting unit 510, a receiving unit 520, a phase-locked loop (PLL) 530, a phase detector (PD) 540, a phase controller (PC) 550, and a control unit 560. The PLL 530 is configured to generate the reference clock signal REFclk having the reference phase/frequency. The phase detector 540 and the phase controller 550 are configured to, during reception of the slave data signal, together extract the timing information from the slave data signal received from the slave apparatus 600 and adjust the phase/frequency of the master clock signal Mclk (relative to that of the reference clock signal REFclk) based on the extracted timing information. The phase/frequency of the master clock signal Mclk may be continually adjusted (as needed)—by controlling the PC 550 from the control unit 560 based on the timing information extracted by the phase detector 540—during reception of the slave data signal to "track" the slave data signal (i.e. to track the change in phase/frequency of the clock signal Sclk used to transmit the slave data signal—relative to that of the reference clock signal REFclk—due to the drift in phase/frequency of the PLL 630 (i.e. in the phase/frequency of the clock signal which the PLL 630 generates). The receiving unit 520 is configured to receive the slave data signal from the slave apparatus 600 according to the master clock signal Mclk as its phase/frequency is adjusted.

The control unit 560 is configured to measure the change in phase/frequency of the master clock signal Mclk as its phase/frequency is adjusted during reception of the slave data signal, e.g. by monitoring its control of the PC 550 based on an input signal received from the phase detector 540. This measure is indicative of a relative drift in phase/frequency of the slave clock signal Sclk, that relative drift being a drift relative to the reference phase/frequency of the reference clock signal REFclk. The control unit 560 is configured to use this measure (of the change in phase/frequency of the master clock signal Mclk as its phase/frequency is adjusted during reception of the slave data signal) to control the phase controller 550 to adjust the phase/frequency of the master clock signal Mclk (relative to that of the reference clock signal REFclk) during transmission of the master data signal to reduce a change (difference) in the phase/frequency of the master clock signal Mclk caused by the adjustment carried out during reception of the slave data signal.

As described above, the PLL 530 generates the reference clock signal REFclk having the reference phase/frequency. The PLL 530 could be replaced with any circuitry (i.e. a clock generator) that generates a clock signal, such as a crystal oscillator clock source. The reference clock signal REFclk could be generated outside the master apparatus 500 and supplied to the master apparatus 500, in which case the master apparatus 500 need not have the PLL 530. The reference phase/frequency provides a reference for the communication system 501. That is, the reference phase/frequency is assumed not to drift (or is treated as if it does not drift) for the purposes of explaining operation of the system 501 (although in reality it may do so). Therefore, where the drift in the PLL 630 of the slave apparatus 600 (i.e. in the phase/frequency of the clock signal which it generates) is referred to, this should be taken to mean a relative drift, that relative drift being relative to the reference phase/frequency.

As described above, the master apparatus 500 comprises a phase detector 540 and a phase controller 550. The phase controller 550 could be a phase interpolator or any circuitry that controls/measures a phase. The phase detector 540 could include the phase controller 550 and could be any circuitry that extracts timing information from a signal and adjusts a phase/frequency of a clock signal (in this case Mclk) based on the extracted timing information. Further, any of the phase detector 540, phase controller 550, the control unit 560 and the PLL 530 could be combined into a single unit. The receiving unit 520, the phase detector 540 and the phase controller 550 may be considered a clock and data recovery (CDR) unit configured to recover a clock signal and data and/or track the clock signal. The receiving unit 520, the phase detector 540 and the phase controller 550 may be considered a clock recovery (CR) unit configured to recover a clock signal but not necessarily the data.

In overview, the slave apparatus 600 is configured to receive a master data signal (downstream data signal) from the master apparatus 500 during a downstream period and, during reception of the master data signal from the master apparatus 500, extract timing information from the master data signal and adjust (adapt/adjust/update/configure/tune) the phase/frequency of a slave clock signal Sclk relative to that of a local clock signal generated by the PLL 630 based on the extracted timing information to enable decoding of the received master data signal based on the slave clock signal Sclk. It is noted that, ultimately, the phase/frequency of the clock signal Sclk is controlled relative to the reference phase/frequency of the reference clock signal REFclk. The slave apparatus 600 is configured to then transmit a slave data signal (an upstream data signal) to the master apparatus 500 during an upstream period based on the slave clock signal Sclk following the adjustment carried out in the preceding downstream period during reception of the master data signal.

In detail, the slave apparatus 600 comprises a transmitting unit 610, a receiving unit 620, a PLL 630, a phase detector (PD) 640 and a phase controller (PC) 650. The PLL 630 is configured to generate a clock signal based on which the slave clock signal Sclk is generated. The clock signal generated by the PLL 630 may be referred to as a local clock signal. The phase detector 540 and the phase controller 650 are configured to, during reception of the master data signal, together extract the timing information from the master data signal and adjust the phase/frequency of the slave clock signal Sclk. The receiving unit 620 is configured to receive the master data signal based on the slave clock signal Sclk. The transmitting unit 610 is configured to transmit the slave data signal based on the slave clock signal Sclk.

The PLL 630, like the PLL 530, could be replaced with any circuitry that generates a clock signal. The phase controller 650 could be a phase interpolator or any circuitry that controls/measures a phase. The phase detector 640 could include the phase controller 650 and could be any circuitry that extracts timing information from a signal and adjusts a phase/frequency of a clock signal based on the extracted timing information. Any of the phase detector 640, phase controller 650, and the PLL 630 could be combined into a single unit. The receiving unit 620, the phase detector 640 and the phase controller 650 may be considered a clock and data recovery (CDR) unit configured to recover a clock signal and data and/or track the clock signal. The receiving unit 620, the phase detector 640 and the phase controller 650 may be considered a clock recovery (CR) unit configured to recover a clock signal but not necessarily the data.

For convenience of comparison, the reference clock signal REFclk generated by the PLL 530 in FIG. 5 has been indicated as comparable to the clock signal MTclk in earlier Figures. Similarly, the master clock signal Mclk output by the PC 550 has been indicated as comparable to the clock signal MRclk, the clock signal generated by the PLL 630 (the local clock signal) to the clock signal STclk, and the slave clock signal Sclk output by the PC 650 to the clock signal SRclk.

Although not shown, the transmitting units 510 and 610 may have data inputs configured to receive data which is to be transmitted via signal line L, or may generate such data internally. Of course, the data values which are transmitted could be set such that the data signals are effectively clock signals. Further, the signal line L is shown as a single two-way signal line, but separate paths for each direction could be used.

Figure 6:
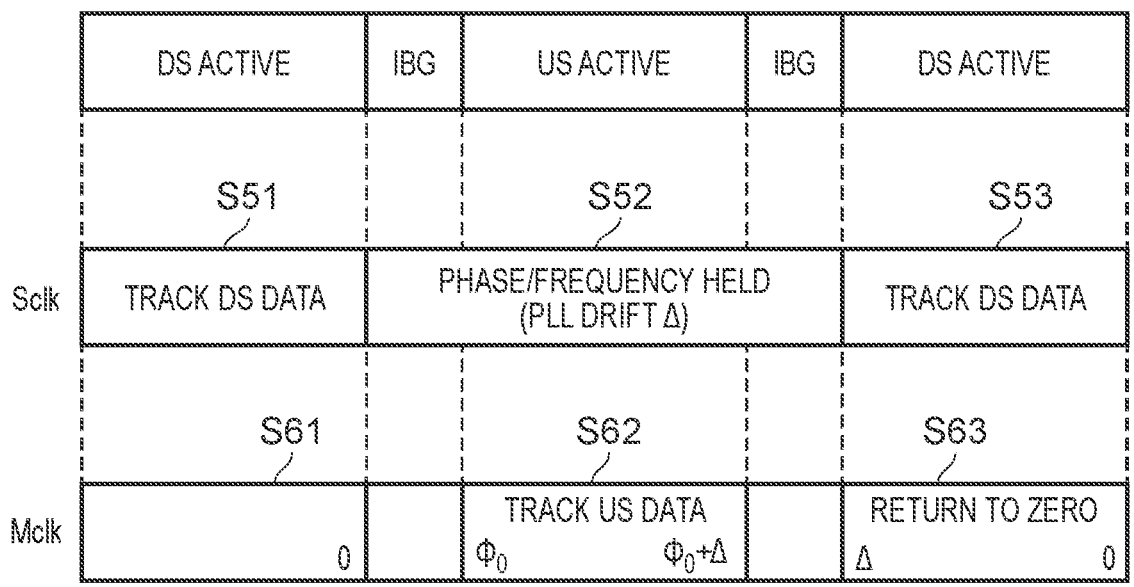
FIG. 6 is a timing diagram useful for understanding FIG. 5.

FIG. 6 is a timing diagram useful for understanding the communication system 501, and may be compared to FIGS. 2 and 4. FIG. 6 shows at steps S51 to S53 how the slave clock signal Sclk is controlled by the phase detector 640 and PC 650, and shows at steps S61 to S63 how the master clock signal Mclk is controlled by the phase detector 540, PC 550 and control unit 560.

At step S51, during a first downstream period (DS ACTIVE), downstream transmission is active (i.e. the master apparatus 500 is transmitting the master data signal (a downstream data signal) to the slave apparatus 600). At the end of this downstream period the phase of the master clock signal Mclk is assumed to be e.g. 0 (i.e. an initial value, offset relative to or the same as the reference phase). The phase/frequency of the slave clock signal Sclk is adjusted during step S51 to track the master data signal and so that at the end of step S51 the phase and frequency of the slave clock signal Sclk is substantially the same as that of the master clock signal Mclk (ignoring cable delay).

During step S52, i.e. during an IBG, during an upstream period (US ACTIVE), during which the slave apparatus 600 transmits the slave data signal (an upstream data signal) to the master apparatus 500 based on the slave clock signal Sclk), and during another IBG, the phase and frequency of the slave clock signal Sclk is held. That is, during step S52 the phase/frequency of the slave clock signal Sclk is not actively adjusted, in the sense that the control provided by the PC 650 may be held or locked, but drifts due to the drift of the (clock signal output by the) PLL 630. As a consequence, the slave data signal transmitted during the upstream period US ACTIVE also drifts in phase/frequency due to the drift of the PLL 630. During step S62 (i.e. during the upstream period US ACTIVE itself) the phase/frequency of the master clock signal Mclk is adjusted relative to the reference phase/frequency of the reference clock signal REFclk to track the slave data signal and therefore changes according to the drift of the PLL 630. Therefore, simplifying phase/frequency to just a consideration of phase for convenience of explanation, the phase/frequency of the master clock signal Mclk at the start of the upstream period is $\phi_0$, (i.e. a phase due to the cable delay), and the phase/frequency of the master clock signal Mclk at the end of the upstream period is $\phi_0+\Delta$, where $\Delta$ is the change in phase/frequency due to the drift of the PLL 630. During the IBGs the phase/frequency of the master clock signal Mclk may not be adjusted and may be held, in the sense that the control provided by the PC 550 may be held or locked. During the IBGs the phase/frequency of the master clock signal Mclk may be shifted to account for cable delay as explained below.

During step S63 (i.e. during the second downstream period—DS ACTIVE—during which the master apparatus 500 transmits e.g. another master data signal (a downstream data signal) to the slave apparatus 600), the phase/frequency of the master clock signal Mclk is adjusted to counteract the change caused by the adjustment of the master clock signal Mclk carried out during step S62 (i.e. during reception of the slave data signal). The phase/frequency of the master clock signal Mclk at the start of step S63 is $\Delta$ (i.e. the phase/frequency of the master clock signal Mclk is shifted at the start of the downstream period—or during the IBG immediately preceding the downstream period—to account for the cable delay). The phase/frequency at the end of step S63 is 0 (i.e. the same as at the end of step S61). During step S53 (i.e. during the second downstream period), the slave apparatus 600 receives the master data signal and the phase/frequency of the slave clock signal Sclk is adjusted to track the master data signal. Therefore the phase/frequency of the slave clock signal Sclk is adjusted with the master data signal to counteract the change in the phase/frequency of the slave clock signal Sclk caused by the drift of the PLL 630 during step S52. The phase/frequency of the slave clock signal Sclk is similarly adjusted during the step S51.

It will be appreciated from the above description that in the communication system 501 each of the master apparatus 500 and the slave apparatus 600 transmits data according to clock signals which have been adjusted during data reception so that the other apparatus can receive that transmitted data more easily (i.e. less alignment is required at the beginning of a data reception period in both of the apparatuses). Further, due to the adjustment of the master clock signal Mclk during transmission of master data signal, the effect of the drift of the PLL 630 relative to the reference phase/frequency is reduced and can (in an ideal case) be completely counteracted.

In practice, the cable delay and therefore the phase $\phi_0$ (referred to herein as the cable delay phase) may not be known accurately, for example due to changes in temperature and other effects. That is, there may be some error in the value of $\phi_0$. Therefore in a particular example the quantity $\Delta$ may be partly the change in phase/frequency due to the drift of the PLL 630 (i.e. the drift of the phase/frequency of the local clock signal generated by the PLL 630 relative to the reference phase/frequency) and partly an error in the cable delay phase $\phi_0$. The master apparatus 500 may continually update the expected cable delay based on the history of the cable delay value $\phi_0$ and the currently measured phase change $\Delta$.

As an example, the following equation may be used by the master apparatus 500 to continually update the cable delay phase $\phi_0$:

$$\phi_0'=k\phi_0+(1-k)\Delta$$

where $\phi_0'$ is the 'assumed' cable delay phase of the following period, $\phi_0$ is the cable delay phase of the current period, and k is a forgetting factor (0<k<1).

As above, there may of course be a frequency component in $\phi_0$. The slave apparatus 600 may utilize a similar methodology as well as or instead of the master apparatus 500.

Figure 7:
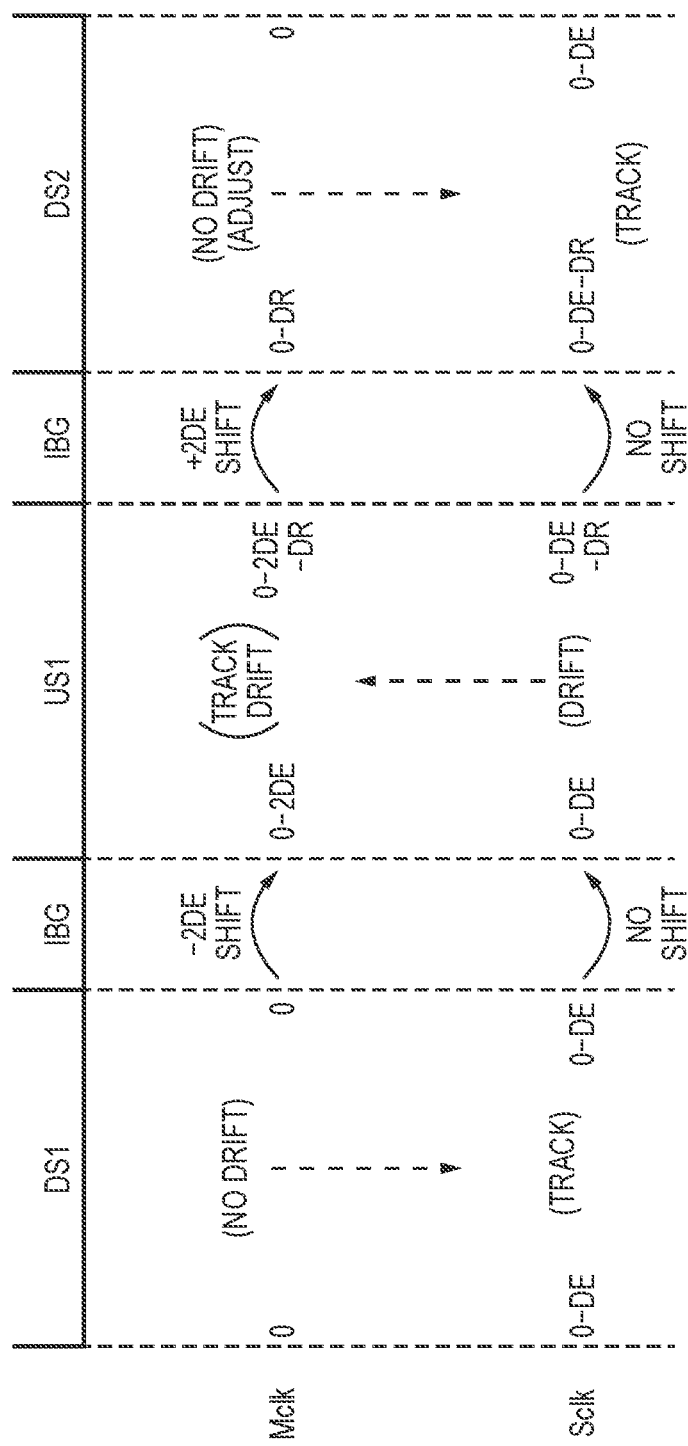
FIG. 7 is a timing diagram useful for understanding FIG. 5.
Figure 8:
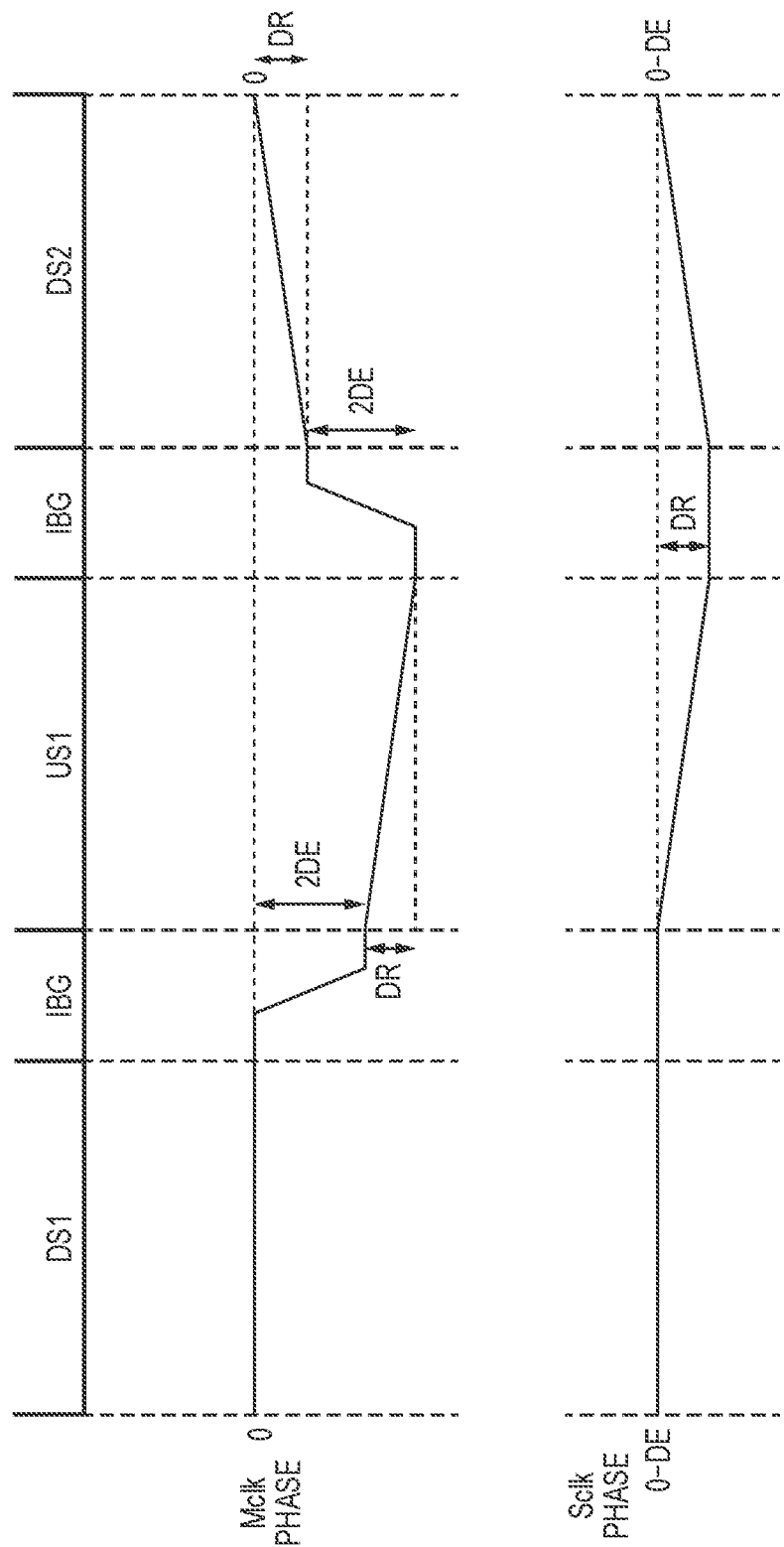
FIG. 8 is a phase diagram useful for understanding FIG. 5.

FIG. 7 is a timing diagram useful for understanding the communication system 501. FIG. 7 shows the phase/frequency of the master clock signal Mclk and of the slave clock signal Sclk at different times during TDD communication. FIG. 8 is a phase diagram useful for understanding the operation of the communication system 501. FIG. 8 shows the phase of the master clock signal Mclk and the phase of the slave clock signal Sclk as the phase/frequency of these clock signals changes during the operation illustrated in FIG. 7. It will be appreciated that the phases and frequencies are illustrated and described relative to the reference phase/frequency. Also, although focus is placed on phase in these diagrams for simplicity it will be understood that there may be frequency and/or phase components in the various changes/adjustments described.

In the downstream period DS1, the master apparatus 500 transmits a prior master data signal to the slave apparatus 600. At the start of DS1 the phase/frequency of the master clock signal Mclk is assumed here for simplicity to be the same as the reference phase/frequency. The reference phase/frequency is shown in FIG. 7 as zero, and the reference phase is shown in FIG. 8 as zero.

During DS1 the phase/frequency of the slave clock signal Sclk is adjusted to track the prior master data signal generated based on the master clock signal Mclk. Therefore the phase/frequency of the slave clock signal Sclk during DS1 is 0-DE, where DE is the difference in phase due to the cable delay. Although the slave clock signal Sclk is shown at 0-DE at the start of DS1 in FIG. 8, the phase/frequency of the slave clock signal Sclk may be different (e.g. unknown) at the start of DS1 and it may take some time (initial locking time) to adjust the phase/frequency of the slave clock signal Sclk to be aligned to the prior master data signal. The slave clock signal Sclk could be considered to be "locked" during DS1 (at least, after the initial locking time) because it is continually adjusted as necessary to be the same as the reference phase/frequency. During DS1 it is assumed that there is no drift in phase/frequency of the master clock signal Mclk since it is generated by the PC 550 from the reference clock signal REFclk itself.

During the upstream period US1, the slave apparatus 600 transmits a slave data signal to the master apparatus 500 based on the slave clock signal Sclk. At the start of US1, as a simplified example, the slave clock signal Sclk has a phase/frequency of 0-DE and the slave apparatus 600 transmits the slave data signal having this phase/frequency of 0-DE. During the IBG immediately preceding US1 as shown in FIG. 8, the phase of the master clock signal Mclk is shifted by −2DE to account for the cable delay (or propagation delay). The cable delay is (at least on average) a known/measured delay, i.e. which can be predicted and/or is continually tracked/measured. Therefore at the start of US1 the master clock signal Mclk initially has substantially the same phase/frequency as the slave data signal when it is received at the master apparatus 500. Alternatively, the phase of the master clock signal Mclk could be shifted by −2DE at the start of US1.

In practice, the phase/frequency of the slave clock signal Sclk drifts during the IBG due to the drift of the PLL 630 and therefore some alignment of the master clock signal Mclk with the slave data signal based on timing information extracted from the slave data signal is initially required for US1. However the amount of alignment required may be small compared to the amount of alignment that would be required if the slave apparatus 600 were to transmit the slave data signal based on a clock signal obtained directly from the PLL 630 without adjustment (i.e. as in the communication system 101). The drift of the phase of the slave clock signal Sclk compared to the reference phase during the IBGs is not illustrated in FIG. 8 (i.e. effectively ignored) for simplicity.

During US1, the phase/frequency of the slave clock signal Sclk drifts due to the drift in the PLL 630 (relative to the reference phase/frequency) and at the end of US1 the phase/frequency of the slave clock signal Sclk is 0-DE-DR, where DR is the total drift during US1 due to the drift in the PLL 630. The phase drift is shown in FIG. 8. The phase/frequency of the slave data signal changes during US1 according to the drift of the slave clock signal Sclk. During US1, the phase/frequency of the master clock signal Mclk is adjusted to track the slave data signal and therefore at the end of US1 the phase/frequency of the master clock signal Mclk is 0-2DE-DR. It is assumed here for simplicity that the drift is always negative, but this need not be the case.

During DS2 the master apparatus 500 transmits a master data signal to the slave apparatus 600 based on the master clock signal Mclk after the adjustment carried out during US1. During the IBG immediately preceding DS2 the phase of the master clock signal Mclk is shifted by +2DE to account for the cable delay. That is, due to the adjustment of the phase/frequency of the master clock signal Mclk and due to the +2DE shift, at the start of DS2 the master data signal has the same phase/frequency as the slave clock signal Sclk when the master data signal is received at the slave apparatus 600. Alternatively, the phase of the master clock signal Mclk could be shifted at the start of DS2.

Again, in practice, the phase/frequency of the slave clock signal Sclk drifts during the IBG due to the drift of the PLL 630 and therefore some alignment of the slave clock signal Sclk with the master data signal based on timing information extracted from the master data signal is initially required for DS2. However the amount of alignment required is small compared to the amount of alignment that would be required if the master apparatus 500 were to transmit the master data signal based on a clock signal generated by e.g. the PLL 530 without adjustment during US1 (i.e. as in the communication systems 101 and 301).

During DS2 the phase/frequency of the master clock signal Mclk is gradually adjusted to counteract (or reduce) the change caused by the adjustment of the phase/frequency of the master clock signal Mclk during US1. That is, the phase/frequency of the master clock signal Mclk is gradually adjusted back to 0, i.e. back to the reference phase/frequency. The adjustment of the phase of the master clock signal Mclk is illustrated in FIG. 8. The phase/frequency of the (clock information embodied by the) master data signal changes with the phase/frequency of the master clock signal Mclk. During DS2 the slave apparatus 600 extracts timing information from the master data signal and adjusts the phase/frequency of the slave clock signal Sclk to track the master data signal. Therefore at the end of DS2 the phase/frequency of the slave clock signal Sclk is 0-DE.

Since the phase positions at the end of DS2 are the same as those at the end of DS1, the operation of communication system 501 can then continue from the end of step DS1. That is, an IBG would follow DS2, and then an upstream period as in US1, followed by another downstream period as in DS2, and so on and so forth.

In the communication system 501, the time taken for the master apparatus 500 to align to the slave data signal is greatly reduced compared to the communication system 101, and the time taken for the slave apparatus 600 to align to the prior master data signal and the master data signal (downstream data signals) is greatly reduced compared to the communication systems 101 and 301.

Further, the problem of the drift of the PLL 630 (i.e. the relative drift between the phase/frequency of the slave clock signal Sclk and the reference phase/frequency) is overcome or addressed because the master apparatus 500 tracks the drift and adjusts the phase/frequency of the master clock signal Mclk during upstream periods (cf. US1), measures the change in the phase/frequency of the master clock signal Mclk as its phase/frequency is adjusted during upstream periods (cf. US1), and then adjusts the phase/frequency of the master clock signal Mclk during the downstream periods (e.g. DS2) to reduce the change caused by the adjustment during the upstream period. The communication system 501 is able to compensate for large relative drifts between the PLL 630 and the reference phase/frequency. Therefore a less accurate, and therefore less expensive, PLL (and other associated components) could be used in the slave apparatus 600 and/or master apparatus 500 compared to e.g. the communication systems 101 and 301. Alternatively, the system 501 could have improved performance (locking time, data throughput, etc.) as compared to the systems 101 and 301 if like PLLs and other associated components are used.

In the example described above, the master clock signal Mclk is shifted (by ±2DE) to account for the cable delay, with no equivalent shifting of the slave clock signal Sclk. In other examples, the slave clock signal Sclk is shifted to account for the cable delay. In other examples, both of the master and slave clock signals Mclk and Sclk are shifted to account for the cable delay (for example each may be shifted by ±DE).

As illustrated in FIG. 8, the phase drift of the slave clock signal Sclk during upstream periods and the phase adjustment of the master clock signal Mclk during downstream periods is shown as uniform (e.g. linear) for ease of explanation, however this may not be the case in practice. For example, the phase (or phase and/or frequency) adjustment of the master clock signal Mclk may be carried out over only a part of one or more downstream periods or each downstream period, and/or may be carried out so that the rate of phase adjustment is not constant or linear throughout one or more downstream periods or each downstream period.

In the example of the operation of the communication system 501 described above, the relative drift between the PLL 630 and the reference phase/frequency is measured by the master apparatus 500 (specifically by the control unit 560) during each upstream period. In other examples of operation, the relative drift in phase/frequency could be pre-stored. That is the relative drift in phase/frequency could be measured over a period of time and averaged to estimate the relative drift during each upstream period. In such an example, during normal operation of the communication system 501, the operation of the control unit 560 may be simplified to apply a pre-stored adjustment during DS2.

As described above, the phase/frequency of the master clock signal Mclk is adjusted during DS2 so that at the end of DS2 the phase/frequency of the master clock signal Mclk is 0 (the reference phase/frequency), i.e. the same as the phase/frequency of the master clock signal Mclk at the end of DS1. In other examples, the phase/frequency of the master clock signal Mclk does not need to be adjusted so that it has the same value as at the end of DS1. Instead the phase/frequency of the master clock signal Mclk could be adjusted by a smaller amount, and in a later downstream period similar to step DS2 the phase/frequency of the master clock signal Mclk could then be adjusted by a larger amount so that at the end of that downstream period the phase/frequency of the master clock signal Mclk is the same as that at the end of DS1.

Also, as described above, the phase/frequency of the master clock signal Mclk is adjusted gradually over substantially the whole of DS2, in a linear manner. However, the phase/frequency of the master clock signal Mclk could be adjusted (back towards 0) over a smaller proportion (i.e. a sub-period) of DS2, for example over at least (or only, or up to) 20%, 50% or 90% of that period, and potentially in stages and not necessarily in a linear manner.

Figure 9:
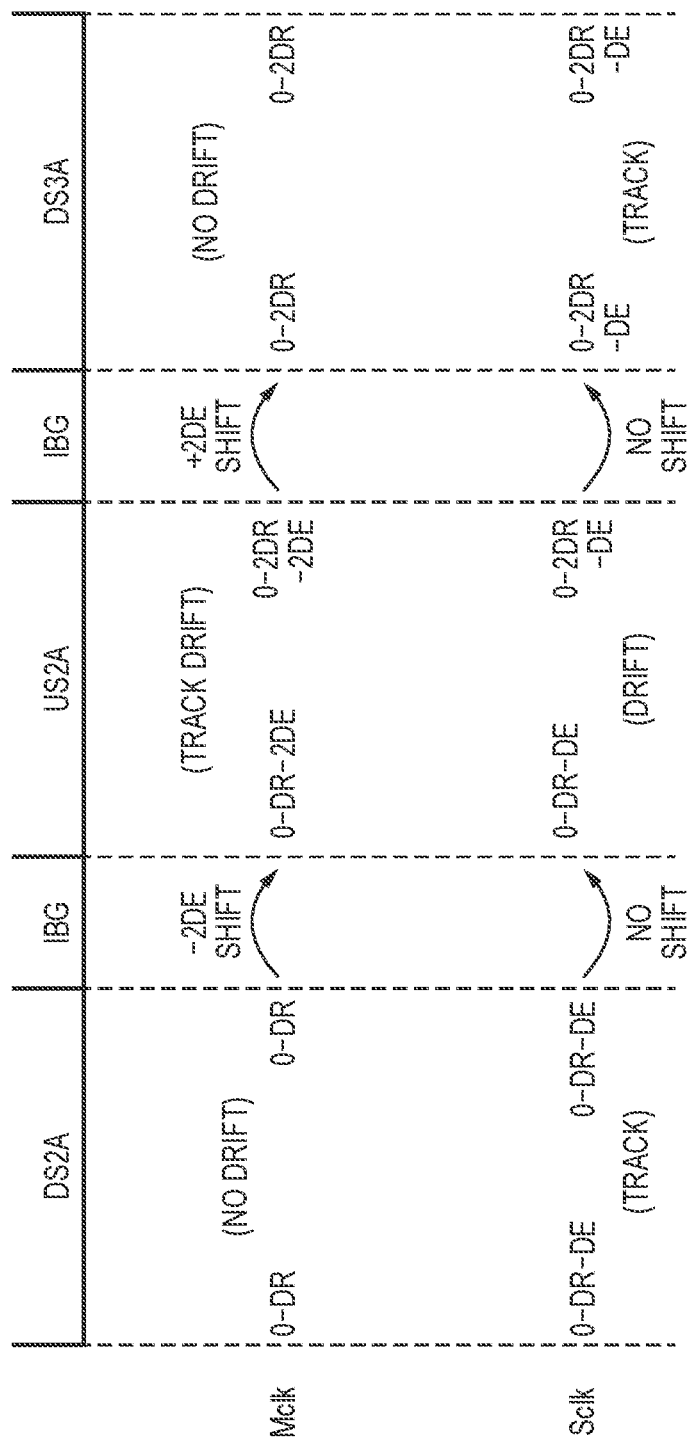
FIG. 9 is a timing diagram useful for understanding FIG. 5.

FIG. 9 is a timing diagram useful for understanding a variation in operation of the communication system 501. FIG. 9 illustrates a downstream period DS2A as an alternative to DS2, and an upstream period US2A and another downstream period DS3A to follow DS2A. That is, FIG. 9 represents an alternative operation mode to that illustrated in FIG. 7, which continues after the IBG following US1 in FIG. 7.

In DS2A, the phase/frequency of the master clock signal Mclk is not adjusted during transmission of the master data signal to reduce the change caused by the adjustment of the phase/frequency of the master clock signal Mclk carried out during US1. Instead, the phase/frequency of the master clock signal Mclk is held.

The operation of the communication system 501 during US2A is the same as that during US1, although in US2A the phase/frequency of the master clock signal Mclk and of the slave clock signal Sclk are both offset by DR, the drift of the slave clock signal Sclk during US1. That is, at the start of US2 the phase of the master clock signal Mclk is shifted by −2DE to account for the cable delay. During US2A the slave apparatus 600 transmits to the master apparatus 500 a second slave data signal based on the slave clock signal Sclk. The phase/frequency of the master clock signal Mclk is adjusted to track the second slave data signal. At the end of US2A the phase/frequency of both the master clock signal Mclk and the slave clock signal Sclk has changed by—DR due to the drift of the slave clock signal Sclk (due to the relative drift between the PLL 630 and the reference phase/frequency).

The operation of the communication system 501 during DS3A is the same as that during DS2A, although in DS3A the phase/frequency of the master clock signal Mclk and of the slave clock signal Sclk are both offset by an additional DR, the drift of the slave clock signal during US2A. It will be appreciated that the operation described above can continue, i.e. that the operation can return to the end of DS2A after DS3A, but that the relative drift between the PLL 630 and the reference phase/frequency will cause the difference between the reference phase/frequency and the phase/frequency of the master and slave clock signals Mclk and Sclk to grow with successive periods. Of course, it is a simplification that the drifts in successive upstream periods are equal (i.e. all DR), creating the sequence DR, 2DR, 3DR, 4DR etc. The drifts may be different in different upstream periods.

The operation of communication system 501 illustrated in FIG. 9 has the advantage that the time taken for the master apparatus 500 to align to the slave data signals is greatly reduced compared to the communication system 101, and the time taken for the slave apparatus 600 to align to the master data signals is greatly reduced compared to the communication systems 101 and 301. That is, the alignment time is due only to the drift during the preceding IBG (and cable delay which is known/measured). The relative drift between the PLL 630 and the reference phase/frequency could be compensated for in a step like DS2 in FIG. 7, where the phase/frequency of the master clock signal Mclk is adjusted by a larger amount (i.e. to account for a cumulative drift of e.g. 2DR, 3DR or 4DR, etc.). Further, the cumulative drift could be compensated for at a higher level. For example the system 501 could "reset" at a certain point in time, i.e. use the reference clock signal REFclk as the master clock signal Mclk for a particular downstream period (e.g. like DS1) and disregard all previous tracking and adjustments of phase/frequency. The system 501 could then continue to use the above described operation methods after such a "reset". In either case, the control unit 560 may not be required to measure the change in the phase/frequency of the master clock signal Mclk as its phase/frequency is adjusted during reception of the slave data signal (during upstream periods), or at least not in all such upstream periods, and instead the relative drift between the PLL 630 and the reference phase/frequency could be pre-stored (i.e. measured over a period of time in advance) and/or predicted.

The communication system 501 has been described using the terms "master" and "slave". The terms "first" and "second", or "primary" and "secondary" could be used in place of "master" and "slave", which may be considered merely labels. That is, the apparatuses (or devices) 500 and 600 need not have a master-slave operation and may be two of the substantially the same type of apparatus. In other examples, the apparatus 500 could be a slave apparatus and the apparatus 600 could be a master apparatus. That is, a slave apparatus (which, in any event, might be referred to as a master apparatus) could implement the adjustment of its clock signal during transmission to counteract the relative drift (i.e. the adjustment carried out by the master apparatus 500 on the master clock signal Mclk in the period DS2 in FIG. 7).

In the above description the cable delay (or propagation delay) has been described as being the same for transmission from the master apparatus 500 to the slave apparatus 600 and vice versa (at least on average). However, the cable delay for transmission from the master apparatus 500 to the slave apparatus 600 could be different to the cable delay for transmission from the slave apparatus 600 to the master apparatus 500.

According to the above description, during reception of upstream data signals the master clock signal Mclk is adjusted based on the extracted timing information so that it may be used in the reception. Instead of the master clock signal Mclk being adjusted in this way, a definition (or descriptor) of the master clock signal Mclk could be adjusted and used in the reception. That is, the upstream data signal could be received using an oversampling technique. Similarly, according to the above description, during reception of downstream data signals the slave clock signal Sclk is adjusted based on the extracted timing information so that it may be used in the reception. Instead of the slave clock signal Sclk being adjusted in this way, a definition (or descriptor) of the slave clock signal Sclk could be adjusted and used in the reception. That is, the upstream data signal and/or downstream data signal could be received using an oversampling technique which operates based on such definitions/descriptors. Such a definition/descriptor could effectively be a value or set of values representative of a phase and/or frequency corresponding to that of a clock signal suitable to be used in such signal reception. The present disclosure will be understood accordingly.

In the communication system 101, the alignment times (or "re-lock" times) of the master and slave apparatuses 100 and 200 (i.e. the time taken for the clock signal MRclk to be adjusted to be "aligned" with (have a phase/frequency suitable for receiving) an upstream data signal and the time taken for the clock signal SRclk to be adjusted to be "aligned" with (have a phase/frequency suitable for receiving) a downstream data signal) are long relative to the alignment times in communication system 501. In the communication system 301 the alignment time of the slave apparatus 400 (i.e. the time taken for the clock signal SRclk to be "aligned" with (have a phase/frequency suitable for receiving) a master data signal) is long relative to the corresponding alignment time of the slave apparatus 600 in the communication system 501.

The shorter alignment times in the communication system 501 lead to more available bandwidth because less bandwidth is used for alignment. Alternatively/in addition, the shorter alignment times in the communication system 501 mean that the maximum allowed PLL jitter (short-term deviations or phase/frequency changes, e.g. from average periodicity) in the communication 501 is increased compared to the communication systems 101 and 301.

A particular way of considering alignment times is that, in general, for the communications systems 101, 301 and 501, the available alignment time (i.e. how much time is permitted to be used for alignment—according to system requirements, for example) determines the maximum allowed PLL drift and similarly the maximum allowed PLL jitter (short-term phase/frequency changes).

In the communication system 501, large drifts in the PLL 630 (i.e. in the phase/frequency of the local clock signal which the PLL 630 generates, relative to the reference phase/frequency) can be compensated for and so the system is very robust against interfering factors such as power supply variations. The improved robustness reduces the requirements on the power supply, thus reducing cost.

In the communication system 501, the master clock signal Mclk may have the reference phase/frequency at the end of each downstream period (as described above), and therefore the timing of the communication system 501 is substantially guaranteed without any (or with reduced) clock slip (that is, the phase/frequency of the data signals is equal to—or at least relatively close to (e.g. within tolerances)—the reference phase/frequency).

In any of the above aspects, the various features may be implemented in hardware, or as software modules running on one or more processors. Features of one aspect may be applied to any of the other aspects.

The invention also provides a computer program or a computer program product for carrying out any of the methods described herein, and a computer readable medium having stored thereon a program for carrying out any of the methods described herein. A computer program embodying the invention may be stored on a computer-readable medium, or it could, for example, be in the form of a signal such as a downloadable data signal provided from an Internet website, or it could be in any other form.

In particular, the control unit 560 may be implemented in hardware, or as software modules running on one or more processors, or as a computer program or a computer program product.

The invention claimed is:

1. A communication system comprising a master apparatus and a slave apparatus, wherein:
   the slave apparatus is configured, in an upstream period, to transmit a slave data signal to the master apparatus based on a slave clock signal; and
   the master apparatus is configured to:
      during reception of the slave data signal from the slave apparatus in the upstream period, extract timing information from the slave data signal and adjust a phase and/or frequency of a master clock signal or a definition thereof relative to a reference phase and/or frequency based on the extracted timing information to enable decoding of the received slave data signal based on the master clock signal or that definition;
      in a downstream period, transmit a master data signal to the slave apparatus based on the master clock signal according to the adjustment carried out during reception of the slave data signal in the upstream period; and
      adjust the phase and/or frequency of the master clock signal during transmission of the master data signal in the downstream period to reduce a change in the phase and/or frequency of the master clock signal effected according to the adjustment carried out during reception of the slave data signal in the upstream period,
   wherein the slave apparatus is configured to, during reception of the master data signal from the master apparatus in the downstream period, extract timing information from the master data signal and adjust the phase and/or frequency of the slave clock signal or a definition thereof based on that extracted timing information to enable decoding of the received master data signal based on the slave clock signal or that definition.

2. The communication system as claimed in claim 1, wherein the master apparatus is configured, in the downstream period, to adjust the phase and/or frequency of the master clock signal during transmission of the master data signal to counteract the change in the phase and/or frequency of the master clock signal effected according to the adjustment carried out during reception of the slave data signal.

3. The communication system as claimed in claim 1, wherein the master apparatus is configured, in the downstream period, to adjust the phase and/or frequency of the master clock signal:
   gradually, during transmission of the master data signal; and/or
   so that the adjustment is carried out over at least 20%, 50%, 90% or 100% of the transmission of the master data signal or of the downstream period.

4. The communication system as claimed in claim 1, wherein the master apparatus is configured, in the downstream period, to adjust the phase and/or frequency of the master clock signal during transmission of the master data signal to reduce a change in the phase and/or frequency of the master clock signal effected according to an adjustment of the phase and/or frequency of the master clock signal or the definition thereof carried out during reception of a plurality of said slave data signals in corresponding upstream periods.

5. The communication system as claimed in claim 1, wherein the master apparatus is configured to obtain a measure of the change in the phase and/or frequency of the master clock signal as the phase and/or frequency of the master clock signal or the definition thereof is adjusted during reception of the slave data signal in the upstream period, that measure indicative of a relative drift in phase and/or frequency of the slave clock signal, that relative drift being a drift relative to the reference phase and/or frequency.

6. The communication system as claimed in claim 1, wherein the master apparatus is configured to:
   for reception of the slave data signal in the upstream period, shift the phase of the master clock signal or the definition thereof by an amount according to an expected propagation delay between the master and slave apparatuses to reduce a phase difference between a phase of the master clock signal or the definition thereof before that shift and a phase of the master clock signal suitable for decoding the slave data signal as received by the master apparatus; and/or
   for transmission of the master data signal in the downstream period, shift the phase of the master clock signal by an amount according to an expected propagation delay between the master and slave apparatuses to reduce a phase difference between a phase of the master clock signal before that shift and a phase of the master clock signal which causes the phase of the slave clock signal to be suitable for decoding the master data signal as received by the slave apparatus.

7. The communication system as claimed in claim 1, wherein the slave apparatus is configured to:
   for transmission of the slave data signal in the upstream period, shift the phase of the slave clock signal by an amount according to an expected propagation delay between the master and slave apparatuses to reduce a phase difference between a phase of the slave clock signal before that shift and a phase of the slave clock signal which causes the phase of the master clock signal to be suitable for decoding the slave data signal as received by the master apparatus; and/or
   for reception of the master data signal in the downstream period, shift the phase of the slave clock signal or a definition thereof by an amount according to an expected propagation delay between the master and slave apparatuses to reduce a phase difference between a phase of the slave clock signal or the definition thereof before that shift and a phase of the slave clock signal suitable for decoding the master data signal as received by the slave apparatus.

8. The communication system as claimed in claim 1, wherein:
   the master apparatus is configured, in a prior downstream period, to transmit to the slave apparatus a prior master data signal based on the master clock signal, prior to reception of the slave data signal in the upstream period; and
   the slave apparatus is configured to:
      during reception of the prior master data signal from the master apparatus in the prior downstream period, extract timing information from the prior master data signal and adjust the phase and/or frequency of the slave clock signal or a definition thereof based on that extracted timing information to enable decoding of the received prior master data signal based on the slave clock signal; and
      in the upstream period, transmit the slave data signal based on the slave clock signal according to the adjustment carried out during reception of the prior master data signal.

9. The communication system as claimed in claim 8, wherein the master apparatus is configured to transmit the prior master data signal based on the master clock signal having substantially the reference phase and/or frequency.

10. A method of communication in a communication system comprising a master apparatus and a slave apparatus, the method comprising:
   by the slave apparatus, in an upstream period, transmitting to the master apparatus a slave data signal based on a slave clock signal; and
   by the master apparatus:
      during reception of the slave data signal from the slave apparatus in the upstream period, extracting timing information from the slave data signal and adjusting a phase and/or frequency of a master clock signal or a definition thereof relative to a reference phase and/or frequency based on the extracted timing information to enable decoding of the received slave data signal based on the master clock signal or that definition;
      in a downstream period, transmitting a master data signal to the slave apparatus based on the master clock signal according to the adjustment carried out during reception of the slave data signal in the upstream period; and
      adjusting the phase and/or frequency of the master clock signal during transmission of the master data signal in the downstream period, to reduce a change in the phase and/or frequency of the master clock signal effected according to the adjustment carried out during reception of the slave data signal in the upstream period,
   wherein the method further comprises, by the slave apparatus, during reception of the master data signal from the master apparatus in the downstream period, extracting timing information from the master data signal and adjusting the phase and/or frequency of the slave clock signal or a definition thereof based on that extracted timing information to enable decoding of the received master data signal based on the slave clock signal or that definition.

11. A communication device for use as a master apparatus in a communication system comprising the master apparatus and a slave apparatus, the communication device configured to:

in an upstream period, receive a slave data signal from the slave apparatus and, during reception of the slave data signal from the slave apparatus in the upstream period, extract timing information from the slave data signal and adjust a phase and/or frequency of a master clock signal or a definition thereof relative to a reference phase and/or frequency based on the extracted timing information to enable decoding of the received slave data signal based on the master clock signal or that definition;

in a downstream period, transmit a master data signal to the slave apparatus based on the master clock signal according to the adjustment carried out during reception of the slave data signal in the upstream period; and adjust the phase and/or frequency of the master clock signal during transmission of the master data signal in the downstream period to reduce a change in the phase and/or frequency of the master clock signal effected according to the adjustment carried out during reception of the slave data signal in the upstream period, wherein the communication device is configured to obtain a measure of the change in the phase and/or frequency of the master clock signal as the phase and/or frequency of the master clock signal or the definition thereof is adjusted during reception of the slave data signal in the upstream period, that measure indicative of a relative drift in phase and/or frequency of the slave clock signal, that relative drift being a drift relative to the reference phase and/or frequency.

12. A method of communication carried out by a communication device for use as a master apparatus in a communication system comprising the master apparatus and a slave apparatus, the method comprising:

in an upstream period, receiving a slave data signal from the slave apparatus and, during reception of the slave data signal from the slave apparatus in the upstream period, extracting timing information from the slave data signal and adjusting the phase and/or frequency of a master clock signal or a definition thereof relative to a reference phase and/or frequency based on the extracted timing information to enable decoding of the received slave data signal based on the master clock signal or that definition;

in a downstream period, transmitting a master data signal to the slave apparatus based on the master clock signal according to the adjustment carried out during reception of the slave data signal in the upstream period; and adjusting the phase and/or frequency of the master clock signal during transmission of the master data signal in the downstream period to reduce a change in phase and/or frequency of the master clock signal effected according to the adjustment carried out during reception of the slave data signal in the upstream period, and wherein the method further comprises obtaining a measure of the change in the phase and/or frequency of the master clock signal as the phase and/or frequency of the master clock signal or the definition thereof is adjusted during reception of the slave data signal in the upstream period, that measure indicative of a relative drift in phase and/or frequency of the slave clock signal, that relative drift being a drift relative to the reference phase and/or frequency.

13. A control unit for use in a communication device, the communication device being for use as a master apparatus in a communication system comprising the master apparatus and a slave apparatus in which the communication device is configured to:

in an upstream period, receive a slave data signal from the slave apparatus and, during reception of the slave data signal from the slave apparatus in the upstream period, extract timing information from the slave data signal and adjust a phase and/or frequency of a master clock signal or a definition thereof relative to a reference phase and/or frequency based on the extracted timing information to enable decoding of the received slave data signal based on the master clock signal or that definition; and in a downstream period, transmit a master data signal to the slave apparatus based on the master clock signal according to the adjustment carried out during reception of the slave data signal in the upstream period, wherein the control unit is configured to adjust the phase and/or frequency of the master clock signal during transmission of the master data signal in the downstream period to reduce a change in the phase and/or frequency of the master clock signal effected according to the adjustment carried out during reception of the slave data signal in the upstream period, and wherein the communication device is configured to obtain a measure of the change in the phase and/or frequency of the master clock signal as the phase and/or frequency of the master clock signal or the definition thereof is adjusted during reception of the slave data signal in the upstream period, that measure indicative of a relative drift in phase and/or frequency of the slave clock signal, that relative drift being a drift relative to the reference phase and/or frequency.

14. A communication system comprising a master apparatus and a slave apparatus, wherein:

the slave apparatus is configured, in an upstream period, to transmit a slave data signal to the master apparatus based on a slave clock signal; and the master apparatus is configured to:

during reception of the slave data signal from the slave apparatus in the upstream period, extract timing information from the slave data signal and adjust a phase and/or frequency of a master clock signal or a definition thereof relative to a reference phase and/or frequency based on the extracted timing information to enable decoding of the received slave data signal based on the master clock signal or that definition;

in a downstream period, transmit a master data signal to the slave apparatus based on the master clock signal according to the adjustment carried out during reception of the slave data signal in the upstream period; and adjust the phase and/or frequency of the master clock signal during transmission of the master data signal in the downstream period to reduce a change in the phase and/or frequency of the master clock signal effected according to the adjustment carried out during reception of the slave data signal in the upstream period, wherein the master apparatus is configured, in the downstream period, to adjust the phase and/or frequency of the master clock signal during transmission of the master data signal to counteract the change in the phase and/or frequency of the master clock signal effected according to the adjustment carried out during reception of the slave data signal.

15. A communication system comprising a master apparatus and a slave apparatus, wherein:

the slave apparatus is configured, in an upstream period, to transmit a slave data signal to the master apparatus based on a slave clock signal; and the master apparatus is configured to:

during reception of the slave data signal from the slave apparatus in the upstream period, extract timing information from the slave data signal and adjust a phase and/or frequency of a master clock signal or a definition thereof relative to a reference phase and/or frequency based on the extracted timing information to enable decoding of the received slave data signal based on the master clock signal or that definition;

in a downstream period, transmit a master data signal to the slave apparatus based on the master clock signal according to the adjustment carried out during reception of the slave data signal in the upstream period; and adjust the phase and/or frequency of the master clock signal during transmission of the master data signal in the downstream period to reduce a change in the phase and/or frequency of the master clock signal effected according to the adjustment carried out during reception of the slave data signal in the upstream period, wherein the master apparatus is configured, in the downstream period, to adjust the phase and/or frequency of the master clock signal during transmission of the master data signal to reduce a change in the phase and/or frequency of the master clock signal effected according to an adjustment of the phase and/or frequency of the master clock signal or the definition thereof carried out during reception of a plurality of said slave data signals in corresponding upstream periods.

16. A communication system comprising a master apparatus and a slave apparatus, wherein:

the slave apparatus is configured, in an upstream period, to transmit a slave data signal to the master apparatus based on a slave clock signal; and the master apparatus is configured to:

during reception of the slave data signal from the slave apparatus in the upstream period, extract timing information from the slave data signal and adjust a phase and/or frequency of a master clock signal or a definition thereof relative to a reference phase and/or frequency based on the extracted timing information to enable decoding of the received slave data signal based on the master clock signal or that definition;

in a downstream period, transmit a master data signal to the slave apparatus based on the master clock signal according to the adjustment carried out during reception of the slave data signal in the upstream period; and adjust the phase and/or frequency of the master clock signal during transmission of the master data signal in the downstream period to reduce a change in the phase and/or frequency of the master clock signal effected according to the adjustment carried out during reception of the slave data signal in the upstream period, wherein the master apparatus is configured to obtain a measure of the change in the phase and/or frequency of the master clock signal as the phase and/or frequency of the master clock signal or the definition thereof is adjusted during reception of the slave data signal in the upstream period, that measure indicative of a relative drift in phase and/or frequency of the slave clock signal, that relative drift being a drift relative to the reference phase and/or frequency.

17. The communication system as claimed in claim 16, wherein the master apparatus is configured to obtain the measure of the change in the phase and/or frequency of the master clock signal by measuring the change in the phase and/or frequency of the master clock signal or the definition thereof as the phase and/or frequency of the master clock signal or the definition thereof is adjusted during reception of the slave data signal in the upstream period.

* * * * *